(12) United States Patent  
Takemae et al.

(10) Patent No.: US 8,536,622 B2
(45) Date of Patent: Sep. 17, 2013

(54) SEMICONDUCTOR DEVICE AND POWER SUPPLY APPARATUS

(71) Applicant: Fujitsu Semiconductor Limited, Yokohama (JP)

(72) Inventors: Yoshihiro Takemae, Yokohama (JP); Tsutomu Hosoda, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/786,431

(22) Filed: Mar. 5, 2013

(65) Prior Publication Data

US 2013/0176013 A1    Jul. 11, 2013

Related U.S. Application Data

(62) Division of application No. 13/181,710, filed on Jul. 13, 2011.

(30) Foreign Application Priority Data

Oct. 13, 2010   (JP) ................................ 2010-230820

(51) Int. Cl.
*H01L 29/772*   (2006.01)
(52) U.S. Cl.
USPC ........... 257/192; 257/401; 257/615; 257/773; 257/E29.089; 257/E29.246
(58) Field of Classification Search
USPC ................. 257/183–211, 401, 615, 773–776, 257/E29.089, E29.246–E29.253
See application file for complete search history.

(56) References Cited

U.S. PATENT DOCUMENTS 6,664,624 B2 * 12/2003  Haematsu ..................... 257/700
7,138,698 B2   11/2006  Nakamura et al.
7,550,781 B2    6/2009  Kinzer et al.
(Continued)

FOREIGN PATENT DOCUMENTS

JP      2007-522677       8/2007
WO   WO-2005/079293 A2   9/2005

OTHER PUBLICATIONS

United States Patent and Trademark Office, Requirement for Restriction/Election, mailed Aug. 13, 2012, in connection with [pending] U.S. Appl. No. 13/181,710.

(Continued)

*Primary Examiner* — Robert Hoffberg
*Assistant Examiner* — Eric Ward
(74) *Attorney, Agent, or Firm* — Fujitsu Patent Center

(57) ABSTRACT

A semiconductor device includes a first transistor including a GaN-based semiconductor stacked structure formed over a substrate, a first gate electrode having a plurality of first fingers over the semiconductor stacked structure, a plurality of first drain electrodes provided along the first fingers, and a plurality of first source electrodes provided along the first fingers; a second transistor including the semiconductor stacked structure, a second gate electrode having a plurality of second fingers over the semiconductor stacked structure, the second drain electrodes provided along the second fingers, and a plurality of second source electrodes provided along the second fingers; a drain pad provided over or under the first drain electrodes, and coupled to the first drain electrodes; a source pad provided over or under the second source electrodes, and coupled to the second source electrodes; and a common pad coupled to the first source electrodes and the second drain electrodes.

10 Claims, 15 Drawing Sheets

(56) References Cited

U.S. PATENT DOCUMENTS

| | | |
|---|---|---|
| 7,755,195 B2 | 7/2010 | Ueda |
| 7,821,034 B2 | 10/2010 | Beach et al. |
| 7,910,984 B2 | 3/2011 | Yamaguchi et al. |
| 7,943,955 B2 * | 5/2011 | Haeberlen et al. ............ 257/124 |
| 8,274,121 B2 | 9/2012 | Vorhaus |
| 2005/0156204 A1 | 7/2005 | Uno et al. |
| 2007/0181934 A1 | 8/2007 | Hu et al. |
| 2009/0078965 A1 | 3/2009 | Briere |
| 2011/0316045 A1 | 12/2011 | Liu et al. |
| 2012/0056244 A1 | 3/2012 | Bahl et al. |

OTHER PUBLICATIONS

United States Patent and Trademark Office, Non-Final Rejection, mailed Oct. 30, 2012, in connection with [pending] U.S. Appl. No. 13/181,710.

* cited by examiner

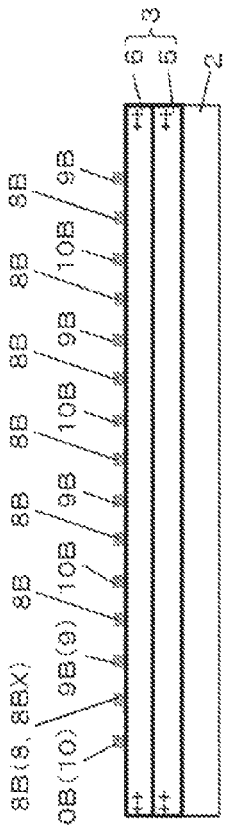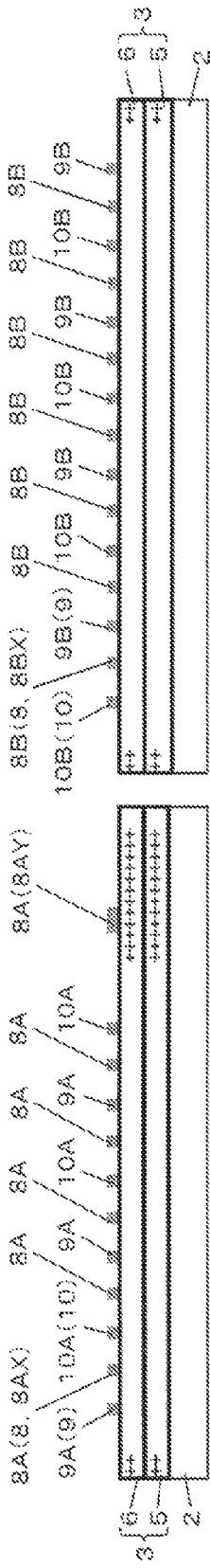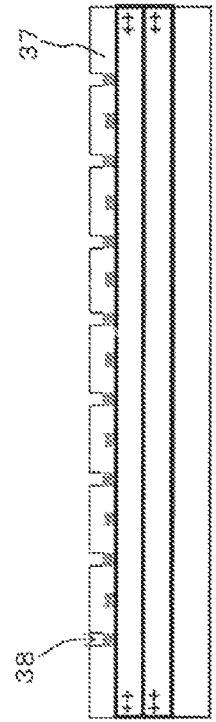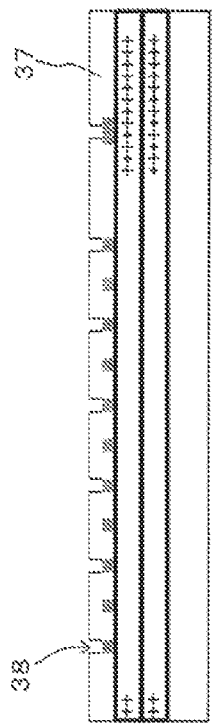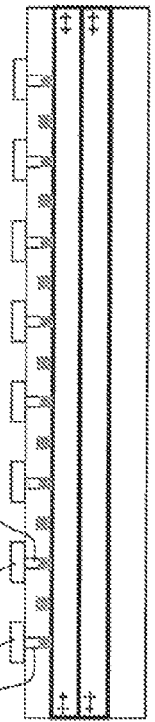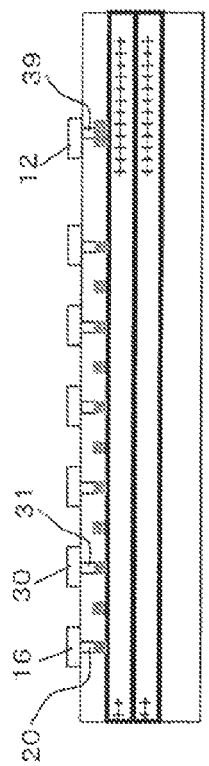

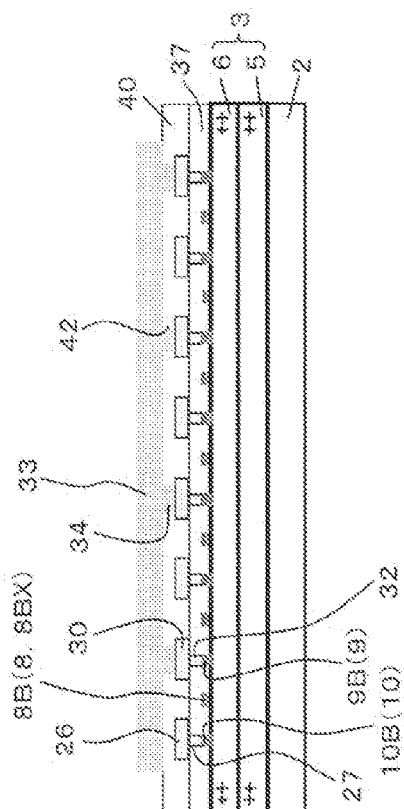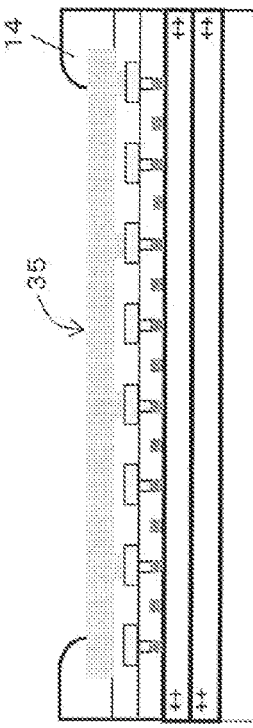
FIG. 8A   FIG. 8B
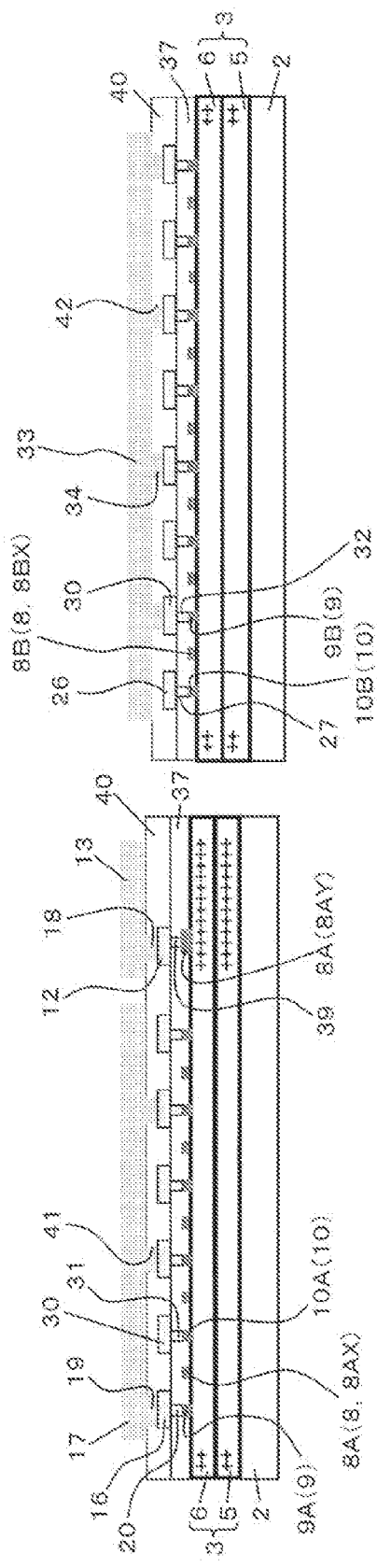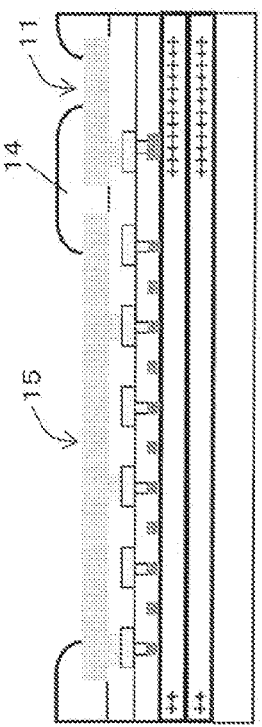
FIG. 8C   FIG. 8D

Q1: High side Tr
Q2: Low side Tr

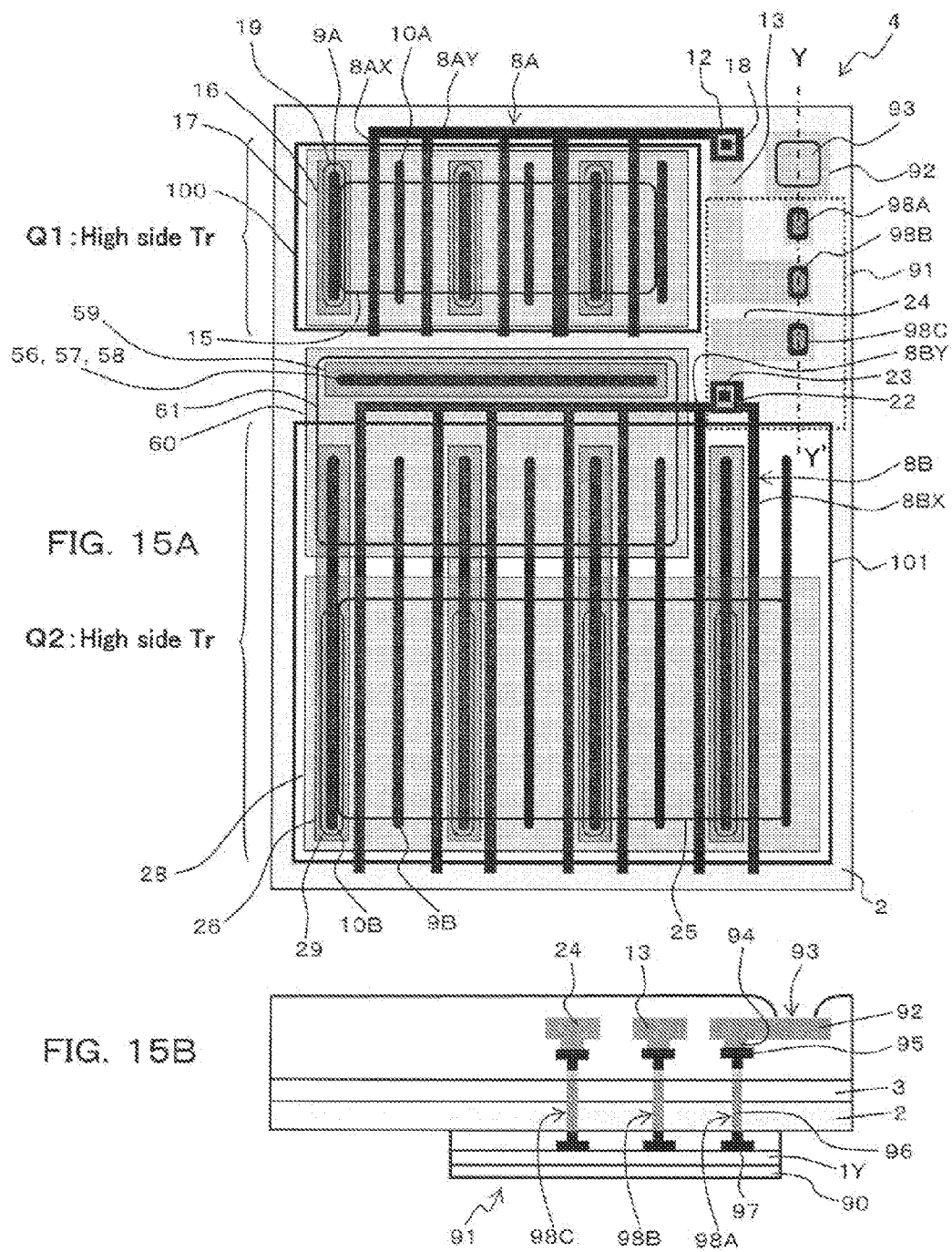

US 8,536,622 B2

SEMICONDUCTOR DEVICE AND POWER SUPPLY APPARATUS

CROSS-REFERENCE TO RELATED APPLICATIONS

This application is a divisional application of U.S. patent application Ser. No. 13/181,710, filed Jul. 13, 2011, which is based upon and claims the benefit of priority of the prior Japanese Patent Application No. 2010-230820, filed on Oct. 13, 2010, the entire contents of which are incorporated herein by reference.

FIELD

The embodiments discussed herein are related to a semiconductor device and a power supply apparatus.

BACKGROUND

A high electron mobility transistor (HEMT) including a GaN-based semiconductor stacked structure, i.e., a power supply apparatus having a GaN-HEMT, has been developed in recent years.

One type of power supply apparatuses includes a DC-DC converter having a high side transistor and a low side transistor coupled to the high side transistor, for example.

One strategy for reducing the size and improving the efficiency of such a power supply apparatus, i.e., a power supply apparatus including one transistor and the other transistor coupled to the one transistor, is to form the one transistor and the other transistor on a single substrate.

In such a case, source fingers coupled to a source pad and drain fingers coupled to a drain pad are arranged alternatingly, and a gate electrode coupled to a gate pad are provided between them in a meandering manner.

SUMMARY

The present semiconductor device is a semiconductor device including: a first transistor including a GaN-based semiconductor stacked structure formed over a substrate, a first gate electrode having a plurality of first fingers over the GaN-based semiconductor stacked structure, a plurality of first drain electrodes provided along the first fingers, and a plurality of first source electrodes provided along the first fingers; a second transistor including the GaN-based semiconductor stacked structure, a second gate electrode having a plurality of second fingers over the GaN-based semiconductor stacked structure, the plurality of second drain electrodes provided along the second fingers, and a plurality of second source electrodes provided along the second fingers; a drain pad provided over or under the plurality of first drain electrodes, and coupled to the plurality of first drain electrodes; a source pad provided over or under the plurality of second source electrodes, and coupled to the plurality of second source electrodes; and a common pad coupled to the plurality of first source electrodes and the plurality of second drain electrodes.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIGS. 1A to 1D are schematic diagrams illustrating the structure of a semiconductor device according to a first embodiment, wherein FIG. 1A is a plan view, FIG. 1B is a cross-sectional view taken along Line X1-X1' in FIG. 1A, FIG. 1C is a cross-sectional view taken along Line X2-X2' in FIG. 1A, and FIG. 1D is a cross-sectional view taken along Line X3-X3' in FIG. 1A;

FIGS. 7A to 7F are schematic cross-sectional views illustrating the method for manufacturing the semiconductor device according to the first embodiment;

FIGS. 8A to 8D are schematic cross-sectional views illustrating the method for manufacturing the semiconductor device according to the first embodiment;

FIGS. 9A to 9D are schematic diagrams illustrating the structure of a variant of the semiconductor device according to the first embodiment, wherein FIG. 9A is a plan view, FIG. 9B is a cross-sectional view taken along Line X1-X1' in FIG. 9A, FIG. 9C is a cross-sectional view taken along Line X2-X2' in FIG. 9A, and FIG. 9D is a cross-sectional view taken along Line X3-X3' in FIG. 9A;

FIGS. 10A to 10C are schematic diagrams illustrating the structure of a semiconductor device according to a second embodiment, wherein FIG. 10A is a plan view, FIG. 10B is a cross-sectional view taken along Line X1-X1' in FIG. 10A, and FIG. 10C is a cross-sectional view taken along Line X2-X2' in FIG. 10A;

FIGS. 12A and 12B are schematic diagrams illustrating the structure of a variant of the semiconductor device according to the second embodiment, wherein FIG. 12A is a plan view, and FIG. 12B is a cross-sectional view taken along Line X1-X1' in FIG. 12A;

FIGS. 15A and 15B are schematic diagrams illustrating the structure of a variant of the semiconductor device according to the second embodiment, wherein FIG. 15A is a plan view, and FIG. 15B is a cross-sectional view taken along Line Y-Y' in FIG. 15A.

DESCRIPTION OF EMBODIMENTS

Going back on the previous discussion, in order to arrange all of the source pad, the source fingers, the drain pad, the drain fingers, the gate pad, and the gate electrode on the same plane, the gate electrode is provided in a meandering configuration between the source fingers and the drain fingers. As a result, the resistance is increased due to the arrangement of the gate electrodes, the drain fingers as the drain electrodes, the source fingers as the source electrodes, and pads coupled to those electrodes, which results in reduced conversion efficiency of the power supply apparatus.

Accordingly, preventing reduction in the conversion efficiency caused by increased resistance is needed.

Hereinafter, a semiconductor device and a power supply apparatus according to embodiments will be described with reference to the drawings.

First Embodiment

A semiconductor device and a power supply apparatus according to a first embodiment will be described with reference to FIGS. 1A to 8D.

Figure 1:
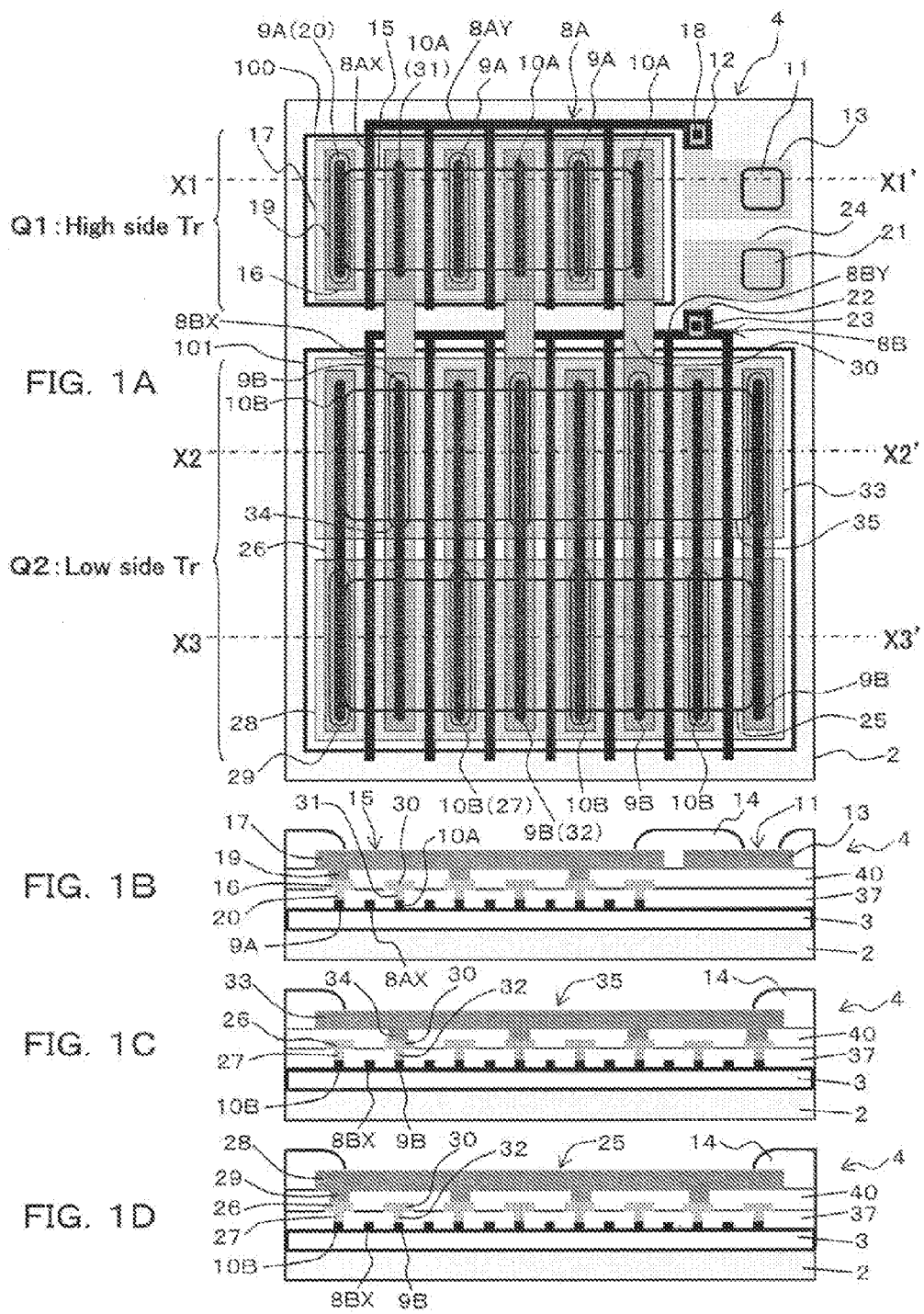
Figure 2:
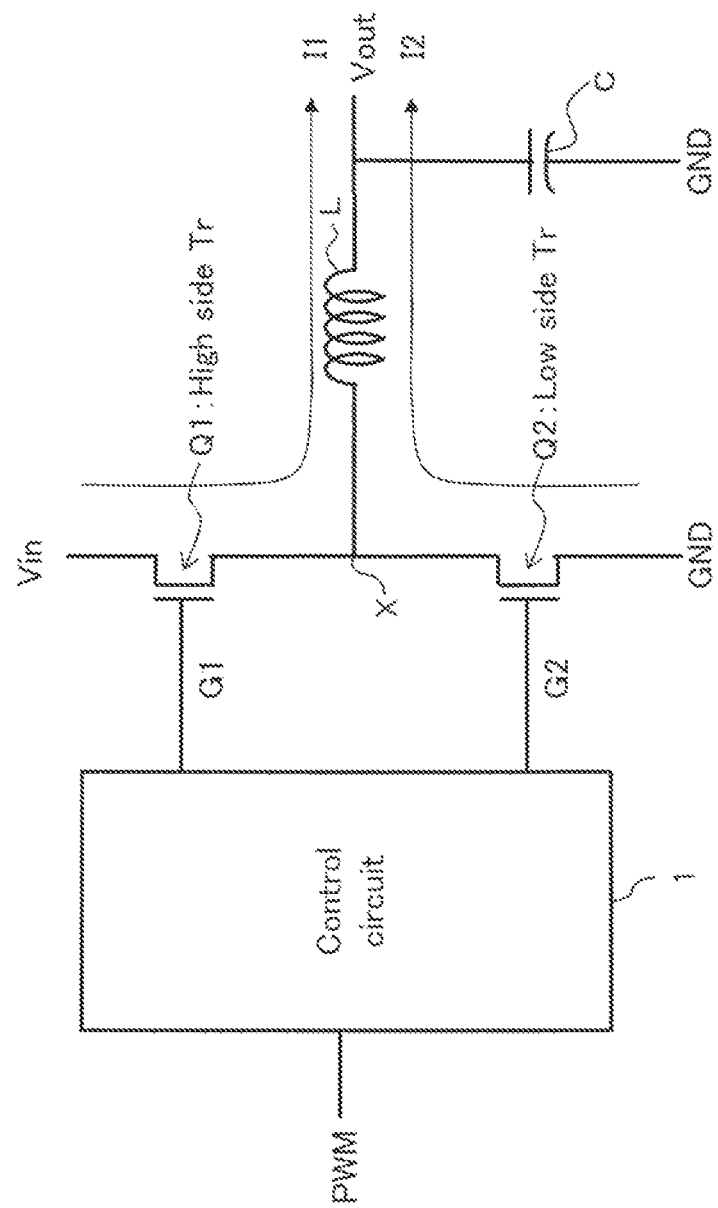
FIG. 2 is a cross-sectional view illustrating the structure of a power supply apparatus according to the first embodiment.

The power supply apparatus according to the present embodiment is a power supply apparatus including one transistor Q1, and the other transistor Q2 coupled to the one transistor Q1, as depicted in FIG. 2. Herein, a DC-DC converter will be described as an example of the power supply apparatus.

This DC-DC converter includes a high side transistor Q1, and a low side transistor Q2 coupled to the high side transistor Q1. An input voltage Vin is supplied from an input terminal into a drain of the high side transistor Q1, while a source of the low side transistor Q2 is grounded (GND; ground potential). One end of a coil (inductor) L is coupled to the connection point X between a source of the high side transistor Q1 and a drain of the low side transistor Q2. In addition, the other end of the coil L is coupled to an output terminal. In addition, the other end of the coil L is further grounded via a capacitor C. Furthermore, a control circuit (driving circuit) 1 to control the high side transistor Q1 and the low side transistor Q2 is coupled to a gate electrode of the high side transistor Q1 and a gate electrode of the low side transistor Q2. In other words, the control circuit 1 to output control signals is coupled to the gate electrodes of the transistors Q1 and Q2 for controlling turning on or off of the transistors Q1 and Q2. The control circuit 1 outputs, respectively, to the gate electrodes of the transistors Q1 and Q2, control signals with reversed polarities each other, thereby stepping down the input voltage Vin input from the input terminal, which is output from the output terminal as an output voltage Vout.

Figure 3:
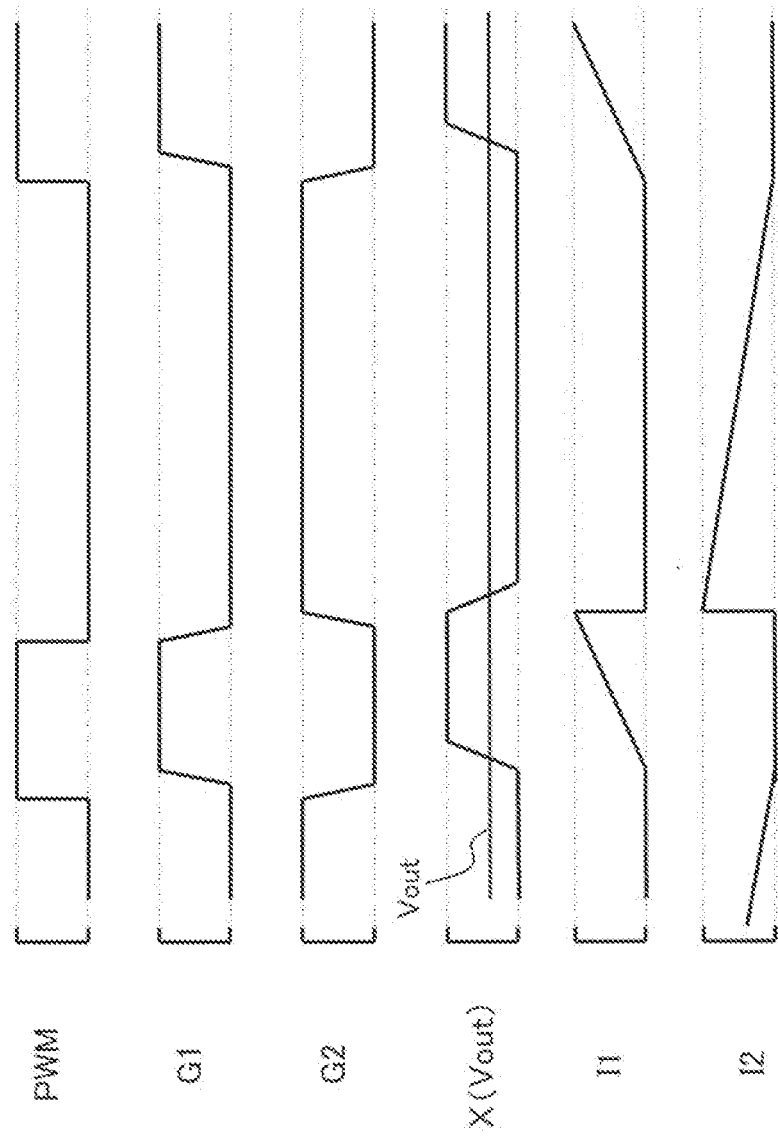
FIG. 3 is a time chart illustrating the operation of the power supply apparatus according to the first embodiment.

In this DC-DC converter, as depicted in FIG. 3, when a pulse width modulation (PWM) signal input to the control circuit 1 is turned on, the control circuit 1 turns on a control signal G1 to be output to the gate electrode of the high side transistor Q1, while turning off a control signal G2 to be output to the gate electrode of the low side transistor Q2. As a result, the high side transistor Q1 is turned on while the low side transistor Q2 is turned off. As a result, current I1 flows from the input terminal via the high side transistor Q1 and the coil L. The voltage of the connection point X is changed to Vin−α1. Subsequently, when the PWM signal input to the control circuit 1 is turned off, the control circuit 1 turns off the control signal G1 to be output to the gate electrode of the high side transistor Q1, while turning on the control signal G2 to be output to the gate electrode of the low side transistor Q2. As a result, the high side transistor Q1 is turned off while the low side transistor Q2 is turned on. As a result, current I2 flows from the GND side via the low side transistor Q2 and the coil L. The voltage of the connection point X is changed to GND+α2. By alternatingly turning on and off the high side transistor Q1 and the low side transistor Q2, the input voltage Vin input from the input terminal is stepped down, which is output as the output voltage Vout from the output terminal.

In the present embodiment, as depicted in FIGS. 1A to 1D, the DC-DC converter configured as described above is constructed as a field effect transistor in which the high side transistor Q1 and the low side transistor Q2 are provided on a single substrate 2, and have the same GaN-based semiconductor stacked structure 3. In other words, the DC-DC converter includes a semiconductor chip (semiconductor device) 4 including the high side transistor Q1 and the low side transistor Q2 of the same structures. Accordingly, this DC-DC converter includes the semiconductor chip 4, the coil L coupled to the semiconductor chip 4, the capacitor C coupled to the coil L, and the control circuit 1, coupled to the semiconductor chip 4, to output control signals to the semiconductor chip 4 (see FIG. 2). Note that the reference symbol 100 denotes a high side transistor region while the reference symbol 101 denotes a low side transistor region, in FIG. 1A.

In this example, the semiconductor chip 4 is made from a GaN-based semiconductor material, which is a compound semiconductor material used for power applications, and includes the high side transistor Q1 and the low side transistor Q2 using a GaN-HEMT having a HEMT structure. Note that such a semiconductor device is also referred to as a power semiconductor device.

Figure 4:
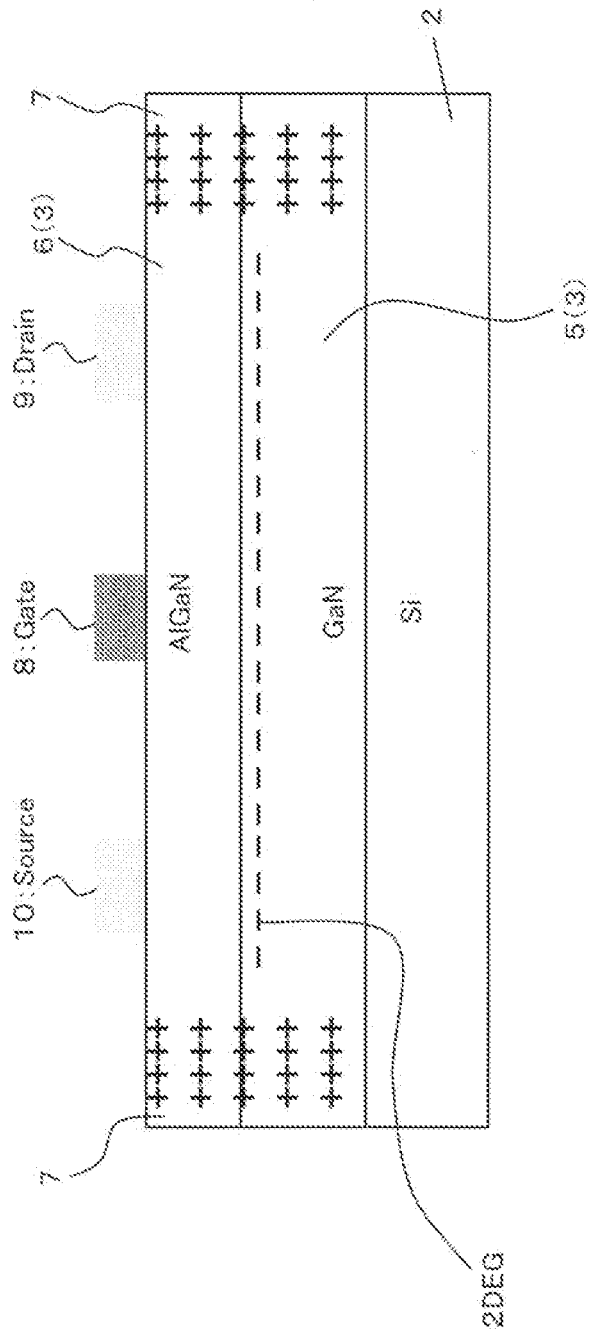
FIG. 4 is a schematic cross-sectional view illustrating the structure of the semiconductor device according to the first embodiment.

In this semiconductor device, the high side transistor Q1 and the low side transistor Q2 are GaN-HEMTs, and have a GaN-based semiconductor stacked structure (GaN-HEMT structure) 3 in which a GaN electron transit layer 5 and an AlGaN electron supply layer 6 are stacked sequentially over the Si substrate 2, as depicted in FIG. 4. In the GaN-HEMT, strain is induced in AlGaN due to the difference in the lattice constants of AlGaN and GaN, inducing piezoelectric polarization. Higher density two-dimensional electron gas (2DEG) is generated by the piezoelectric polarization and the spontaneous polarization of AlGaN. In this example, inactive regions (element isolation regions) 7 are generated by positive ions, for example, around the transistors Q1 and Q2. Although the Si substrate 2 is used in this example, substrates made from other materials, such as sapphire, SiC, and GaN, may be used.

A gate electrode 8, a drain electrode 9, and a source electrode 10 are provided over the GaN-based semiconductor stacked structure 3 configured as described above. In this example, the gate electrode 8 made of Ti, for example, is formed over the AlGaN electron supply layer 6. In addition, the drain electrode 9 and the source electrode 10 made of Al, for example, are formed over the AlGaN electron supply layer 6. Note that a gate insulation film may be disposed under the gate electrode 8. Additionally, a gate recess may also be provided. Furthermore, the electrodes may be made from any of other materials or may have any of other structures.

Particularly, in the present embodiment, as depicted in FIGS. 1A and 1B, a plurality of GaN-HEMTs are provided as the high side transistor (first transistor) Q1. Accordingly, the high side transistor Q1 includes a first gate electrode 8A having a plurality of first fingers 8AX, a plurality of first drain electrodes 9A provided along the first fingers 8AX, and a plurality of first source electrodes 10A provided along the first fingers 8AX.

In this example, the first gate electrode 8A includes a first runner 8AY coupled to the plurality of first fingers 8AX and extending in the direction (horizontal direction) perpendicular to the direction (vertical direction) in which the first fingers 8AX extend. In other words, the plurality of first fingers 8AX which substantially function as the gate electrode are coupled to a first gate pad 1 via the first runner 8AY. For example, the first runner 8AY extends to the vicinity of the periphery of the semiconductor chip 4, and the first gate pad 11 is provided over the end of the first runner 8AY via interconnection layers 12 and 13. In this example, a first gate interconnection layer 12 made of Al, for example, is provided via a contact (gate contact) which is not illustrated, over the end of the first runner 8AY, and a first gate redistribution layer 13 made of Cu, for example, is provided via a contact (Al—Cu contact) 18. A portion of the first gate redistribution layer 13 exposed to the surface (the portion not being covered with an insulation film 14) defines the first gate pad 11. In this manner, the control signal G1 from the control circuit 1 is input to the first gate pad 11 coupled to the first gate electrode 8A.

In addition, in this example, the first drain electrode 9A and the first source electrode 10A are provided alternatingly between the plurality of first fingers 8AX.

Especially, a drain pad 15 is provided extending in the direction perpendicular to the direction in which the first drain electrodes 9A extend, over the plurality of first drain electrodes 9A. In other words, the plurality of first drain electrodes 9A are coupled to the drain pad 15. In this example, a plurality of first drain interconnection layers 16 made of Al, for example, are provided, respectively, over the plurality of first drain electrodes 9A. In other words, the plurality of first drain interconnection layers 16 are coupled, respectively, to the plurality of first drain electrodes 9A via contacts (drain contacts) 20. Furthermore, a first drain redistribution layer 17, made of Cu, for example, is provided over the plurality of first drain interconnection layers 16. In other words, the first drain redistribution layer 17 is coupled to the plurality of first drain interconnection layers 16 via contacts (Al—Cu contacts) 19. A portion of the first drain redistribution layer 17 exposed to the surface (the portion not being covered with the insulation film 14) defines the drain pad 15. In other words, a portion of the first drain redistribution layer 17 defines the drain pad 15. In this manner, the input voltage Vin is input to the drain pad 15 coupled to the plurality of first drain electrodes 9A. Accordingly, the drain pad 15 functions as the input terminal. Note that the drain pad 15 is also referred to as an input pad.

In addition, as depicted in FIGS. 1A, 1C, and 1D, a plurality of GaN-HEMTs are provided as the low side transistor (second transistor) Q2. Accordingly, the low side transistor Q2 includes a second gate electrode 8B having a plurality of second fingers 8BX, a plurality of second drain electrodes 9B provided along the second fingers 8BX, and a plurality of second source electrodes 10B provided along the second fingers 8BX.

In this example, the second fingers 8BX are provided in series with the first fingers 8AX in the vertical direction. In the present embodiment, the plurality of second fingers 8BX are provided, respectively, on the extensions of the plurality of first fingers 8AX.

In addition, the second gate electrode 8B includes a second runner 8BY coupled to the plurality of second fingers 8BX and extending in the direction perpendicular to the direction in which the second fingers 8BX extend. In other words, the plurality of second fingers 8BX which substantially function as the gate electrode are coupled to a second gate pad 21 via the second runner 8BY. For example, the second runner 8BY extends to the vicinity of the periphery of the semiconductor chip 4, and the second gate pad 21 is provided over the end of the second runner 8BY via interconnection layers 22 and 24. In this example, the second gate pad 21 is provided so as to adjoin the first gate pad 11. In addition, in this example, a second gate interconnection layer 22 made of Al, for example, is provided via a contact (gate contact) which is not illustrated, over the end of the second runner 8BY, and a second gate redistribution layer 24 made of Cu, for example, is provided via a contact (Al—Cu contact) 23. A portion of the second gate redistribution layer 24 exposed to the surface (the portion not being covered with the insulation film 14) defines the second gate pad 21. In this manner, the control signal G2 from the control circuit 1 is input to the second gate pad 21 coupled to the second gate electrode 8B.

In addition, in this example, the second drain electrode 9B and the second source electrode 10B are provided alternatingly between the plurality of second fingers 8BX. In the present embodiment, the plurality of second drain electrodes 8B are provided, respectively, on the extensions of the plurality of first source electrodes 10A. In addition, the plurality of second source electrodes 10B are provided, respectively, on the extensions of the plurality of first drain electrodes 9A.

Especially, as depicted in FIG. 1A and FIG. 1D, a source pad 25 is provided extending in the direction perpendicular to the direction in which the second source electrodes 10B extend, over the plurality of second source electrodes 10B. In other words, the plurality of second source electrodes 10B are coupled to the source pad 25. In this example, a plurality of second source interconnection layers 26 made of Al, for example, are provided, respectively, over the plurality of second source electrodes 10B. In other words, the plurality of second source interconnection layers 26 are coupled, respectively, to the plurality of second source electrodes 10B via contacts (source contacts) 27. Furthermore, a second source redistribution layer 28 made of Cu, for example, is provided over the plurality of second source interconnection layers 26. In other words, the second source redistribution layer 28 is coupled to the plurality of second source interconnection layers 26 via contacts (Al—Cu contacts) 29. A portion of the second source redistribution layer 28 exposed to the surface (the portion not being covered with the insulation film 14) defines the source pad 25. In other words, a portion of the second source redistribution layer 28 defines the source pad 25. In this manner, the source pad 25 coupled to the plurality of second source electrodes 10B is grounded, and assumes the grounded potential GND. Accordingly, the source pad 25 functions as the ground terminal. Note that the source pad 25 is also referred to as a ground pad.

In addition, in the present embodiment, as depicted in FIGS. 1A, 1B, and 1C, a plurality of common interconnection layers 30 are provided extending, respectivery, from over the first source electrodes 10A to over the second drain electrodes 9B, and being made of Al, for example. In other words, the plurality of common interconnection layers 30 which are provided, respectively, over the plurality of first source electrodes 10A, and are coupled, respectively, to the plurality of first source electrodes 10A, extend, respectively, to over the plurality of second drain electrodes 9B, and are coupled, respectively, to the plurality of second drain electrodes 9B. This configuration helps to couple between the high side transistor Q1 and the low side transistor Q2 at the shortest distance. In this example, the plurality of common interconnection layers 30 are coupled, respectively, to the plurality of first source electrodes 10A via contacts (source contacts) 31. In addition, the plurality of common interconnection layers 30 are coupled, respectively, to the plurality of second drain electrodes 9B via contacts (drain contacts) 32. Furthermore, a common redistribution layer 33 made of Cu, for example, is provided over the plurality of common interconnection layers 30. In other words, the common redistribution layer 33 is coupled to the plurality of common interconnection layers 30 via contacts (Al—Cu contacts) 34. A portion of the common redistribution layer 33 exposed to the surface (the portion not being covered with the insulation film 14) defines the common pad 35. In other words, a portion of the common redistribution layer 33 defines the common pad 35. In this manner, the common pad 35 coupled to the plurality of first source electrodes 10A and the plurality of second drain electrodes 9B via the plurality of common interconnection layers 30 is provided over the plurality of second drain electrodes 9B, and extends in the direction perpendicular to the direction in which the second drain electrodes 9B extend. In this example, the common pad 35 is provided over the plurality of second drain electrodes 9B and in the region where the source pad 25 is not present, adjacent to the source pad 25. Note that the position of the common pad 35 is not limited to this, and the common pad 35 may be provided anywhere as long as the common pad 35 is coupled to the plurality of first source electrodes 10A and the plurality of second drain electrodes 9B. The common pad 35 defines the connection point X between the source of the high side transistor Q1 and the drain of the low side transistor Q2 (see FIG. 2). Accordingly, the coil L and the capacitor C are coupled to the common pad 35, and the output voltage Vout is output from the common pad 35 via the coil L and the capacitor C. Thus, the common pad 35 functions as the output terminal of the semiconductor chip 4. Note that the common pad 35 is also referred to as an output pad.

The redistribution layers 13, 17, 24, 28, and 33 described above are formed as a wafer level package (WLP). In other words, in the present embodiment, the semiconductor chip 4 is a semiconductor chip 4 having a wafer level package. Note that the wafer level package is also referred to as a wafer level chip size package (WL-CSP) or a chip size package (CSP).

Here, the semiconductor chip 4 having the wafer level package is fabricated by forming the redistribution layers 13, 17, 24, 28, and 33 at a wafer level, followed by dicing into individual chips. Accordingly, the semiconductor chip 4 having the wafer level package is a semiconductor chip 4 having a package equally sized to the chip, over the semiconductor element (GaN-based semiconductor element). In other words, the semiconductor chip 4 having the wafer level package is a semiconductor chip 4 having the redistribution layers 13, 17, 24, 28, and 33 over the semiconductor element, as a package equally sized to the chip size.

In this manner, in the present embodiment, the two transistors Q1 and Q2 are integrated on the single substrate 2 to fabricate the semiconductor chip 4 having the wafer level package. Then, the first gate pad 11, the second gate pad 21, the drain pad 15, the source pad 25, and the common pad 35 are provided as bonding pads for coupling to a printed board, such as a printed circuit board (PCB), for example, using wireless bonding, such as flip chip bonding, for example. This may help to reduce the parasitic inductance and resistance, thereby improving the conversion efficiency.

Particularly, alternate turn-on and turn-off of the high side transistor Q1 and the low side transistor Q2 in the DC-DC converter provides voltage conversion, and the speed of this switching is needed to be increased.

However, if the high side transistor Q1 and the low side transistor Q2 would be provided in separate chips and be coupled to each other using wire bonding, the wires would become parasitic capacitances, which is one factor hindering speed enhancement.

Figure 5:
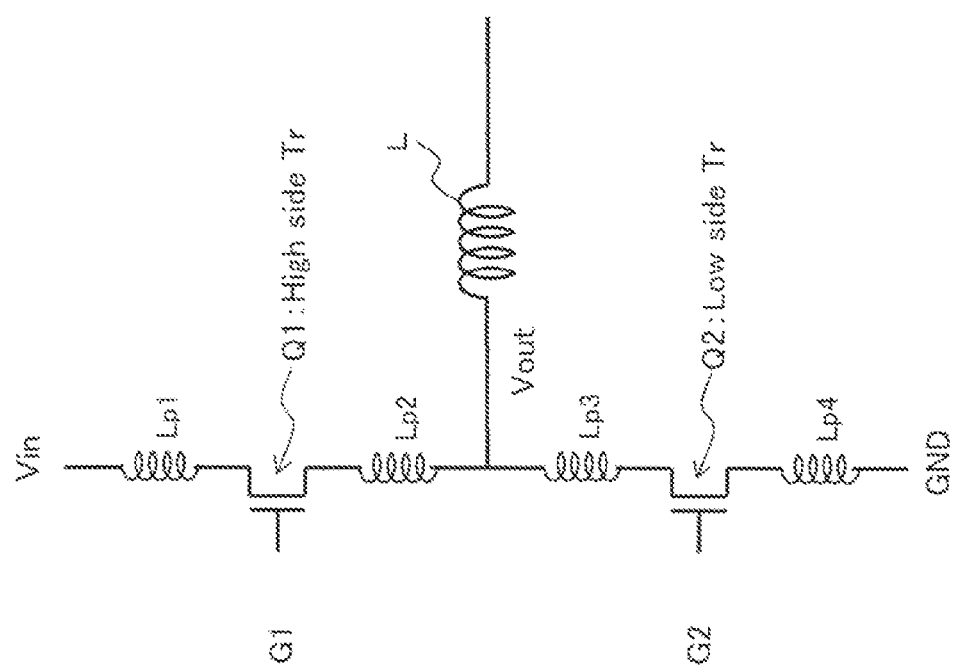
FIG. 5 is a schematic diagram illustrating the problems of a power supply apparatus.

In addition, in a DC-DC converter in which transistors are coupled to each other using wire bonding, parasitic inductances Lp1-Lp4 are present due to bonding wires, as depicted in FIG. 5. The effects of the parasitic inductances become ineligible as the rate of current change (di/dt) is increased due to increased frequencies. More For example, the effects of the parasitic inductances reduce the conversion efficiency, which is one factor hindering speed enhancement.

The above described configuration helps to reduce the parasitic inductance and resistance, thereby improving the conversion efficiency to realize speed enhancement.

Next, a method of manufacturing a semiconductor device according to this embodiment will be described with reference to FIGS. 6A to 8D.

Since this semiconductor device includes a high side transistor Q1 and a low side transistor Q2, which may be formed simultaneously in the same steps, the steps of manufacturing these transistors are depicted in side by side in FIGS. 6A to 8D. Here, FIGS. 6A, 6C, 6E, 7A, 7C, 7E, 8A, and 8C depict the steps of manufacturing the high side transistor Q1, while FIGS. 6B, 6D, 6F, 7B, 7D, 7F, 8B, and 8D depict the steps of manufacturing the low side transistor Q2.

Figure 6A:
FIGS. 6A to 6F are schematic cross-sectional views illustrating a method for manufacturing the semiconductor device according to the first embodiment.
Figure 6B:
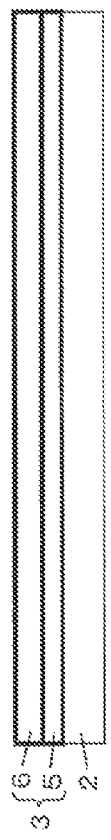

Firstly, as depicted in FIGS. 6A and 6B, a GaN electron transit layer 5 and an AlGaN electron supply layer 6 are formed over a Si substrate 2 in this order, to form a GaN-based semiconductor stacked structure (GaN-based HEMT structure) 3.

Figure 6C:
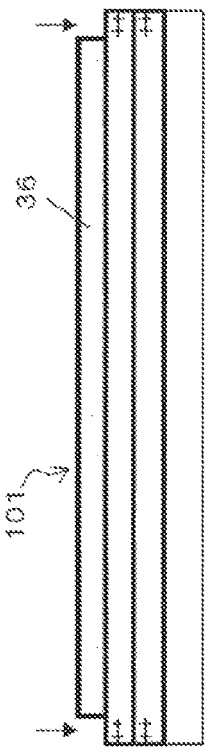
Figure 6D:
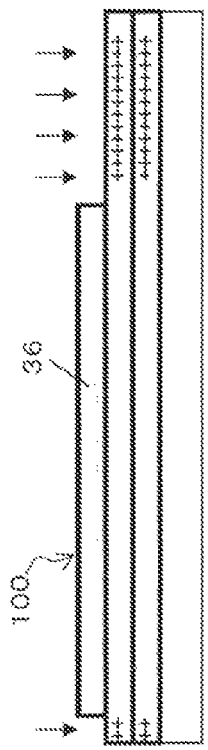

Subsequently, as depicted in FIGS. 6C and 6D, after masking a high side transistor region 100 and a low side transistor region 101 with a resist mask 36, positive ions are implanted to regions other than the high side transistor region 100 and the low side transistor region 101 to form an inactive region (element isolation region) 7.

Subsequently, after removing the resist mask 36, a resist mask having windows in a source electrode formation region and a drain electrode formation region is formed over the AlGaN electron supply layer 6 using photolithography technique, for example.

Figure 6E:
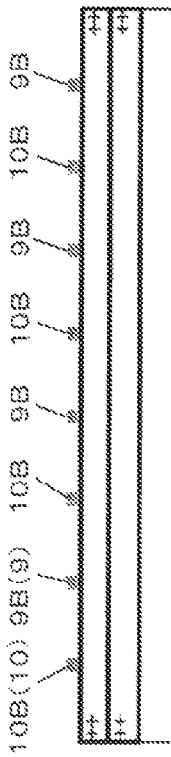
Figure 6F:
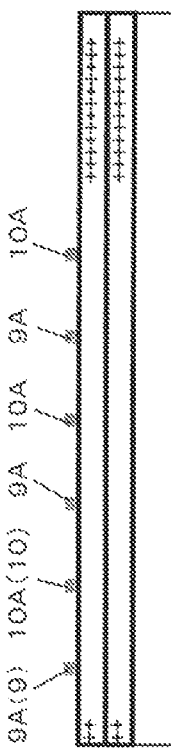
Figure 9A:
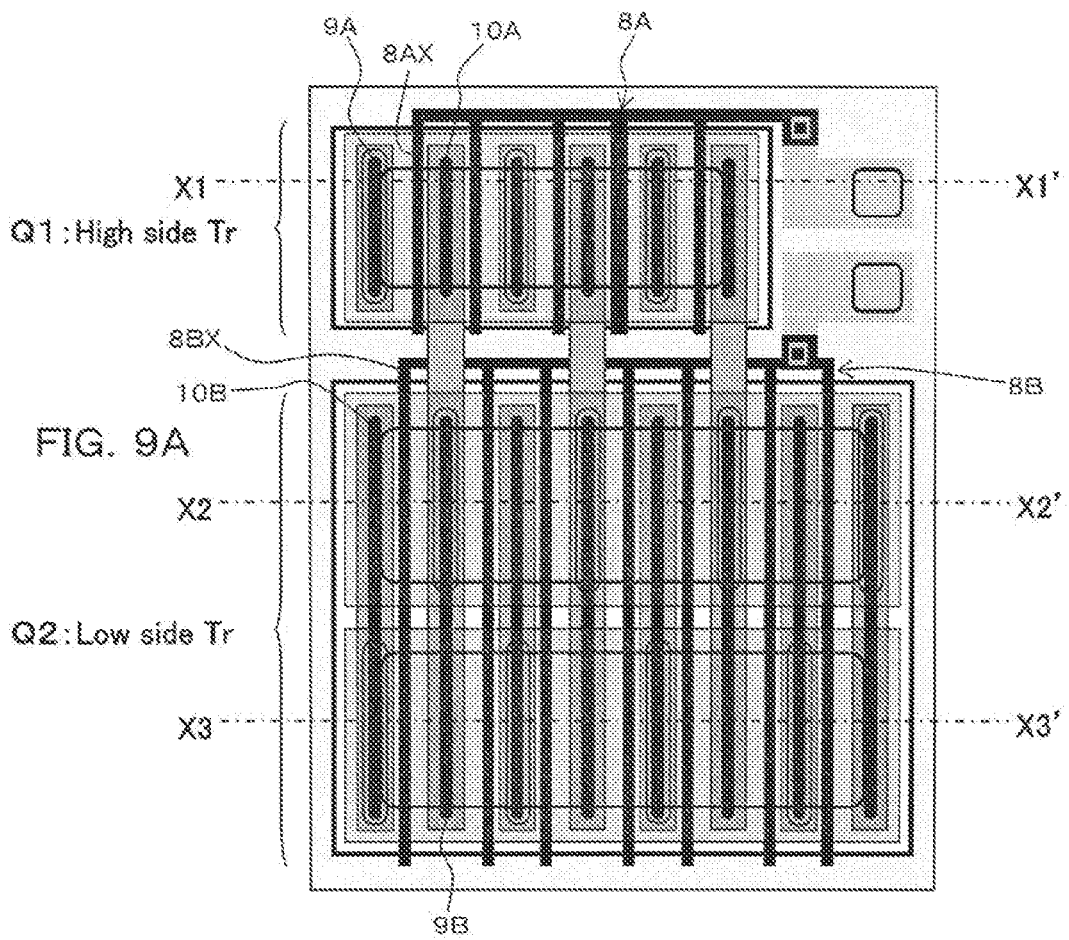
Figure 9B:
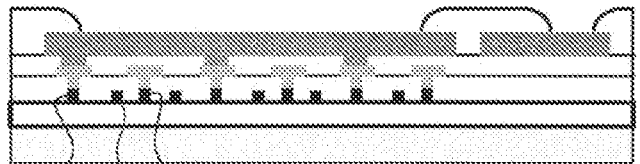
Figure 9C:
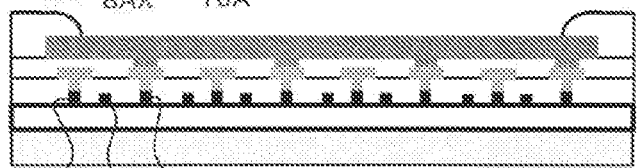
Figure 9D:
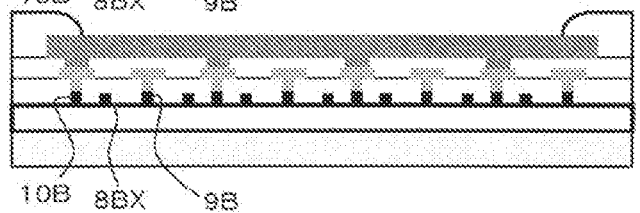

Subsequently, as depicted in FIGS. 6E and 6F, source electrodes 10 and drain electrodes 9, made of Al, for example, are formed in the source electrode formation region and the drain electrode formation region, respectively, over the AlGaN electron supply layer 6, using evaporation and liftoff technique, for example. In other words, first source electrodes 10A and first drain electrodes 9A of the high side transistor Q1 are formed, and second source electrodes 10B and second drain electrodes 9B of the low side transistor Q2 are formed. Annealing is performed thereafter to provide the ohmic characteristic.

Subsequently, a resist mask having a window in a gate electrode formation region is formed over the AlGaN electron supply layer 6 using photolithography technique, for example.

Subsequently, as depicted in FIGS. 7A and 7B, gate electrodes 8 made of Ti, for example, are formed in the gate electrode formation region using evaporation and liftoff technique, for example. In other words, a first gate electrode 8A of the high side transistor Q1 is formed, and a second gate electrode 8B of the low side transistor Q2 is formed.

In this manner, in the high side transistor region 100, a first gate electrode 8A having a plurality of first fingers 8AX, a plurality of first drain electrodes 9A provided, respectively, along the first fingers 8AX, and a plurality of first source electrodes 10A provided, respectively, along the first fingers 8AX, are formed over the GaN-based semiconductor stacked structure (see FIG. 1A).

In addition, in the low side transistor region 101, a second gate electrode 8B having a plurality of second fingers 8BX, a plurality of second drain electrodes 9B provided, respectively, along the second fingers 8BX, and a plurality of second source electrodes 10B provided, respectively, along the second fingers 8BX, are formed over the GaN-based semiconductor stacked structure 3 (see FIG. 1A).

Thereafter, as depicted in FIGS. 7C and 7D, after forming an insulation film (interlayer insulation film) 37 over the entire surface, contact holes 38 are formed, respectively, over the plurality of source electrode 10 and the plurality of drain electrode 9. In addition, contact holes 38 are also formed, respectively, over the end of the first runner 8AY coupled to the plurality of first fingers 8AX of the first gate electrode 8A, and over the end of the second runner 8BY coupled to the plurality of second fingers 8BX of the second gate electrode 8B.

Subsequently, as depicted in FIGS. 7E and 7F, contacts 20, 27, 31, and 32 and interconnection layers 16, 26, and 30, made of Al, for example, are formed, respectively, over the source electrodes 10 and the drain electrodes 9, using evaporation and liftoff technique, for example.

In other words, a first drain interconnection layer 16, coupled to the first drain electrodes 9A of the high side transistor Q1 via the contacts 20, is formed. In addition, a second interconnection layer 26, coupled to the second source electrodes 10B of the low side transistor Q2 via the contacts 27, is formed. Furthermore, a common interconnection layer 30, coupled to the first source electrodes 10A of the high side transistor Q1 and the second drain electrodes 9B of the low side transistor Q2 via the contacts 31 and 32, are formed.

In addition, a first gate interconnection layer 12 is formed over the end of the first runner 8AY of the first gate electrode 8A of the high side transistor Q1, via a contact 39, and a second gate interconnection layer 22, which is not illustrated, is formed over the end of the second runner 8BY of the second gate electrode 8B of the low side transistor Q2, via a contact.

Subsequently, after forming an insulation film (interlayer insulation film) 40 over the entire surface, contact holes are formed, respectively, over the interconnection layers 16, 26, and 30. More For example, as depicted in FIGS. 8A and 8B, contact holes 41 are formed, respectively, over the first drain interconnection layers 16 coupled, respectively, to the first drain electrodes 9A of the high side transistor Q1. In addition, contact holes 42 are formed, respectively, over the common interconnection layers 30 coupled, respectively, to the second drain electrodes 9B of the low side transistor Q2. Furthermore, contact holes, which are not illustrated, are formed, respectively, over the second source interconnection layers 26 coupled, respectively, to the second source electrodes 10B of the low side transistor Q2.

Subsequently, contacts 19, 29, 34 and redistribution layers 17, 28, and 33, made of Cu, for example, are formed, respectively, over the interconnection layers 16, 26, and 30, using evaporation and liftoff technique, for example.

More For example, a first drain redistribution layer 17 coupled via the contacts 20, the first drain interconnection layers 16, and the contacts 19 is formed over the first drain electrodes 9A of the high side transistor Q1. In addition, a common redistribution layer 33 coupled via the contacts 31 and 32, the common interconnection layers 30, and the contacts 34 is formed over the first source electrodes 10A of the high side transistor Q1 and the second drain electrodes 9B of the low side transistor Q2. Furthermore, a second source redistribution layer 28, which is not illustrated, coupled via the contacts 27, the second source interconnection layers 26, and the contacts 29 is formed over the second source electrodes 10B of the low side transistor Q2.

In addition, a first gate redistribution layer 13 is formed over the end of the first runner 8AY of the first gate electrode 8A of the high side transistor Q1, via the contact 39, the first gate interconnection layer 12, and the contact 18. In addition, a second gate redistribution layer 24, which is not illustrated, is formed over the end of the second runner 8BY of the second gate electrode 8B of the low side transistor Q2, via the contact, the second gate interconnection layer 22, and the contact 23.

Subsequently, as depicted in FIGS. 8C and 8D, after forming an insulation film 14 over the entire surface, windows are formed in the drain pad formation region, the common pad formation region, the source pad formation region, the first gate pad formation region, and the second gate pad formation region. Thereby, a portion of the first drain redistribution layer 17 coupled to the first drain electrodes 9A of the high side transistor Q1 is exposed to the surface, which defines a drain pad 15. In addition, a portion of the common redistribution layer 33 coupled to the first source electrodes 10A of the high side transistor Q1 and the second drain electrodes 9B of the low side transistor Q2 is exposed to the surface, which defines a common pad 35. Furthermore, a portion of the second source redistribution layer 28 coupled to the second source electrodes 10B of the low side transistor Q2, which is not illustrated, is exposed to the surface, which defines a source pad 25.

In addition, a portion of the first gate redistribution layer 13 coupled to the first gate electrode 8A of the high side transistor Q1 is exposed to the surface, which defines a first gate pad 11. In addition, a portion of the second gate redistribution layer 24 coupled to the second gate electrode 8B of the low side transistor Q2, which is not illustrated, is exposed to the surface, which defines a second gate pad 21.

The wafer is diced into individual chips, and manufacturing of the semiconductor chip 4 is completed.

On the semiconductor chip 4 fabricated in the above-described processes, solder bumps are formed over the pads 15, 25, 35, 11, and 21, and the semiconductor chip 4 is mounted on a printed board, using wireless bonding, such as flip chip bonding, for example. In addition, a coil L, a capacitor C, a control circuit 1, and the like are also mounted on the printed board, and the manufacturing of a DC-DC converter as a power supply apparatus is completed (see FIG. 2).

As described above, the semiconductor device and the power supply apparatus according to the present embodiment are advantageous in that the size reduction is achieved, while preventing reduction in the conversion efficiency due to an increased resistance.

Although the distance between a respective one of the gate electrodes 8 and a respective one of the drain electrodes 9 is set to be equal to the distance between a respective one of the gate electrodes 8 and a respective one of the source electrodes 10 in the above-described embodiment, this is not limiting. In other words, although the distance between a respective one of the first fingers 8AX of the first gate electrode 8A and a respective one of the first drain electrodes 9A of the high side transistor Q1 is set to be equal to the distance between a respective one of the first fingers 8AX and a respective one of the first source electrodes 10A in the above-described embodiment, this is not limiting. In addition, although the distance between a respective one of the second fingers 8BX of the second gate electrode 8B and a respective one of the second drain electrodes 9B of the low side transistor Q2 is set to be equal to the distance between a respective one of the second fingers 8BX and a respective one of the second source electrodes 10B, this is not limiting.

For example, the distance between a respective one of the gate electrodes 8 and a respective one of the drain electrodes 9 may be set to be greater than the distance between a respective one of the gate electrodes 8 and a respective one of the source electrodes 10. More For example, as depicted in FIGS. 9A to 9D, the distance between a respective one of the first fingers 8AX of the first gate electrode 8A and a respective one of the first drain electrodes 9A of the high side transistor Q1 may be set to be greater than the distance between a respective one of the first fingers 8AX and a respective one of the first source electrodes 10A. In addition, the distance between a respective one of the second fingers 8BX of the second gate electrode 8B and a respective one of the second drain electrodes 9B of the low side transistor Q2 may be set to be greater than the distance between a respective one of the second fingers 8BX and a respective one of the second source electrodes 10B. In this case, the withstand voltage may be improved. In FIGS. 9A to FIG. 9D, the elements similar to the above described embodiment are referenced to by the same reference symbols.

Second Embodiment

A semiconductor device and a power supply apparatus according to a second embodiment will be described with reference to FIGS. 10A to 12B.

The semiconductor device according to the present embodiment is different from the above-described first embodiment in terms of the positions where a common interconnection layer and a common pad are provided.

More For example, in the present embodiment, as depicted in FIGS. 10A to 10C, and FIG. 11, a common interconnection layer 50 and a common pad 51 coupled to first source electrodes 10A of a high side transistor Q1 and second drain electrodes 9B of a low side transistor Q2 are provided in the back face side. In FIGS. 10A to 10C, and FIG. 11, the same elements as those in the above-described first embodiment are referenced to by the like reference symbols.

Figure 10A:
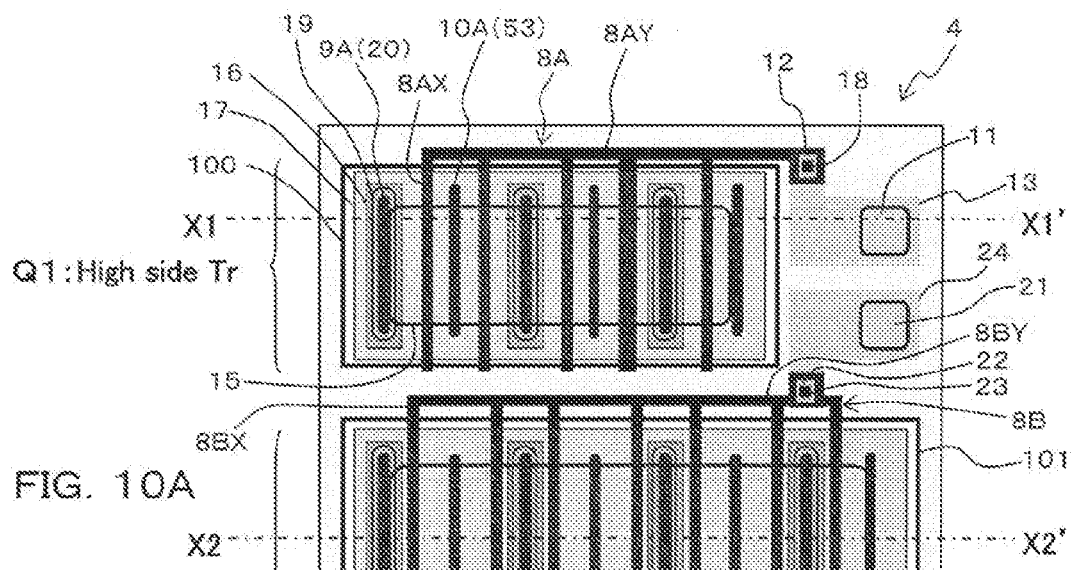
Figure 10B:
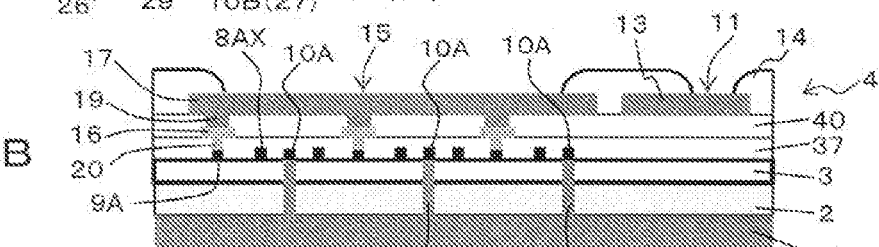

Therefore, in this semiconductor device, as depicted in FIGS. 10A and 10B, first contacts (source contacts) 53 are provided, respectively, in a substrate 2 and a GaN-based semiconductor stacked structure 3 under a plurality of first source electrodes 10A of the high side transistor Q1. More For example, first through holes 52 are provided, respectively, in the substrate 2 and the GaN-based semiconductor stacked structure 3 under the plurality of first source electrodes 10A of the high side transistor Q1, and the first contacts 53 made of Cu, for example, are provided in the respective first through holes 52.

Figure 10C:
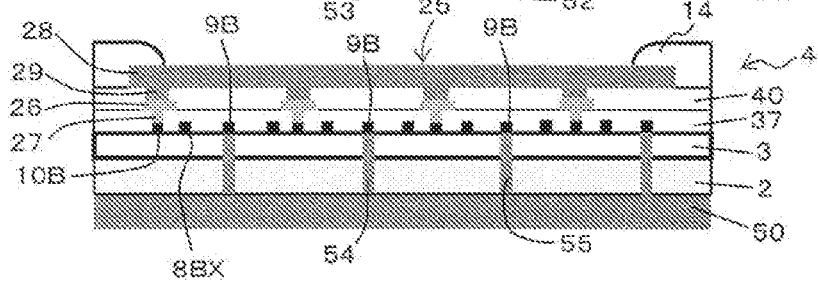

In addition, as depicted in FIGS. 10A and 10C, second contacts (drain contacts) 54 are provided, respectively, in the substrate 2 and the GaN-based semiconductor stacked structure 3 under a plurality of second drain electrodes 9B of the low side transistor Q2. More For example, second through holes 55 are provided, respectively, in the substrate 2 and the GaN-based semiconductor stacked structure 3 under the plurality of second drain electrodes 9B of the low side transistor Q2, and the second contacts 54 made of Cu, for example, are provided in the respective second through holes 55.

Furthermore, as depicted in FIGS. 10B and 10C, a common interconnection layer 50 made of Al, for example, is provided over the back face of the substrate 2. More For example, the common interconnection layer 50 is provided under the plurality of first source electrodes 10A of the high side transistor Q1 and the plurality of second drain electrodes 9B of the low side transistor Q2. The plurality of first source electrodes 10A of the high side transistor Q1 and the common interconnection layer 50 are coupled to each other by the respective first contacts 53. In addition, the plurality of second drain electrodes 9B of the low side transistor Q2 and the common interconnection layer 50 are coupled to each other by the respective second contacts 54.

Figure 11:
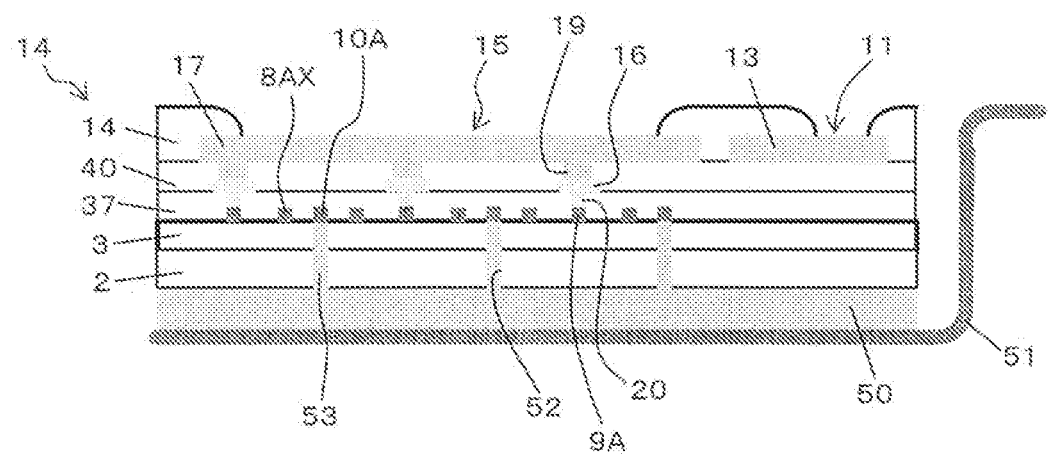
FIG. 11 is a schematic cross-sectional view illustrating the structure of the semiconductor device according to the second embodiment.

In addition, this semiconductor device includes a metal frame 51 coupled to the common interconnection layer 50, as depicted in FIG. 11. This metal frame 51 extends from the back face side to the front face side, and functions as a pad to couple to a printed board. In this example, since the metal frame 51 is a pad coupled to the common interconnection layer 50, it is referred to as a common pad. The metal frame 51 as a common pad is provided under the plurality of first source electrodes 10A and under the plurality of second drain electrodes 9B, and the portion protruding to the side of the substrate 2 is bent to extend to the front face side. If the front face side portion of the metal frame 51, which is to be coupled to the printed board, is viewed as a common pad, this common pad is provided over (For example, obliquely over) the plurality of first source electrodes 10A and over (For example, obliquely over) the plurality of second drain electrodes 9B. In this example, the metal frame 51 is a Cu frame, for example.

Next, a method of manufacturing a semiconductor device according to this embodiment will be described.

A semiconductor chip 4 is fabricated in the manner similar to the manufacturing of the above-described first embodiment, except for the steps of forming a common interconnection layer 50 and attaching a metal frame 51 as a common pad.

In the present embodiment, however, during manufacturing the semiconductor chip 4, contacts 31 and 32 and a common interconnection layer 30 coupled to the first source electrodes 10A of the high side transistor Q1 and the second drain electrodes 9B of the low side transistor Q2, and contacts 34 and a common redistribution layer 33 coupled to the common interconnection layer 30 are not formed. Accordingly, a second source interconnection layer 26 coupled to the second source electrodes 10B of the low side transistor Q2 are formed over the second source electrodes 10B along the entire length thereof, and a second source redistribution layer 28 coupled to the second source interconnection layer 26 is formed in the substantially entire region where the low side transistor Q2 is formed. This may improve the interconnection resistance and the current density.

Then, after forming through holes 52 and 55 in the Si substrate 2 and the GaN-based semiconductor stacked structure 3, contacts 53 and 54 and a common interconnection layer 50 are formed in the through holes 52 and 55 and over the back face of the Si substrate 2. In other words, the first through holes 52 are formed in the Si substrate 2 and the GaN-based semiconductor stacked structure 3 under the first source electrodes 10A of the high side transistor Q1. In addition, the second through holes 55 are formed in the Si substrate 2 and the GaN-based semiconductor stacked structure 3 under the second drain electrodes 9B of the low side transistor Q2. Thereafter, the contacts 53 and 54 and the common interconnection layer 50 made of Cu, for example, are formed in the through holes 52 and 55 and over the back face of the Si substrate 2.

After the wafer is diced into individual chips, the chip is mounted on the metal frame 51 and manufacturing of the semiconductor chip 4 is completed.

The details of other structures and steps in the fabrication method are similar to those in the above-described first embodiment, and descriptions thereof will be omitted.

In this embodiment, however, the distance between a respective one of the gate electrodes 8 and a respective one of the drain electrodes 9 is set so as to be greater than the distance between a respective one of the gate electrodes 8 and a respective one of the source electrodes 10. More For example, the distance between a respective one of the first fingers 8AX of the first gate electrode 8A and a respective one of the first drain electrodes 9A of the high side transistor Q1 is set to be greater than the distance between a respective one of the first fingers 8AX and a respective one of the first source electrodes 10A. In addition, the distance between a respective one of the second fingers 8BX of the second gate electrode 8B and a respective one of the second drain electrodes 9B of the low side transistor Q2 is set to be greater than the distance between a respective one of the second fingers 8BX and a respective one of the second source electrodes 10B.

Accordingly, the semiconductor device and the power supply apparatus according to the present embodiment are advantageous in that the size reduction is achieved, while preventing reduction in the conversion efficiency due to an increased resistance, similar to the above-described first embodiment.

Although interconnection layers 16, 26, 12, and 24 and redistribution layers 17, 28, 13, and 24 are formed in the front face side, and portions of the redistribution layers 17, 28, 13, and 24 define, respectively, pads 15, 25, 11, and 21, in the above-described embodiment, this is not limiting. For example, in the above-described embodiment, the redistribution layers 17, 28, 13, and 24 may be omitted, interconnection layers 16, 26, 12, and 24 may be formed, respectively, in the shapes similar to the redistribution layers 17, 28, 13, and 24, and portions of the interconnection layers 16, 26, 12, and 24 define, respectively, pads 15, 25, 11, and 21. In such a case, a portion of first drain interconnection layer provided over the plurality of first drain electrodes 9A of the high side transistor Q1 and coupled, respectively, to the plurality of first drain electrodes 9A defines a drain pad. In addition, a portion of second source interconnection layer provided over the plurality of second source electrodes 10B of the low side transistor Q2 and coupled, respectively, to the plurality of second source electrodes 10B defines a source pad.

Although the distance between a respective one of the gate electrodes 8 and a respective one of the drain electrodes 9 is set to be greater than the distance between a respective one of the gate electrodes 8 and a respective one of the source electrodes 10 in the above-described embodiment, this is not limiting. For example, similar to the above-described first embodiment, the distance between a respective one of the gate electrodes 8 and a respective one of the drain electrodes 9 may be set to be equal to the distance between a respective one of the gate electrodes 8 and a respective one of the source electrodes 10.

Figure 12A:
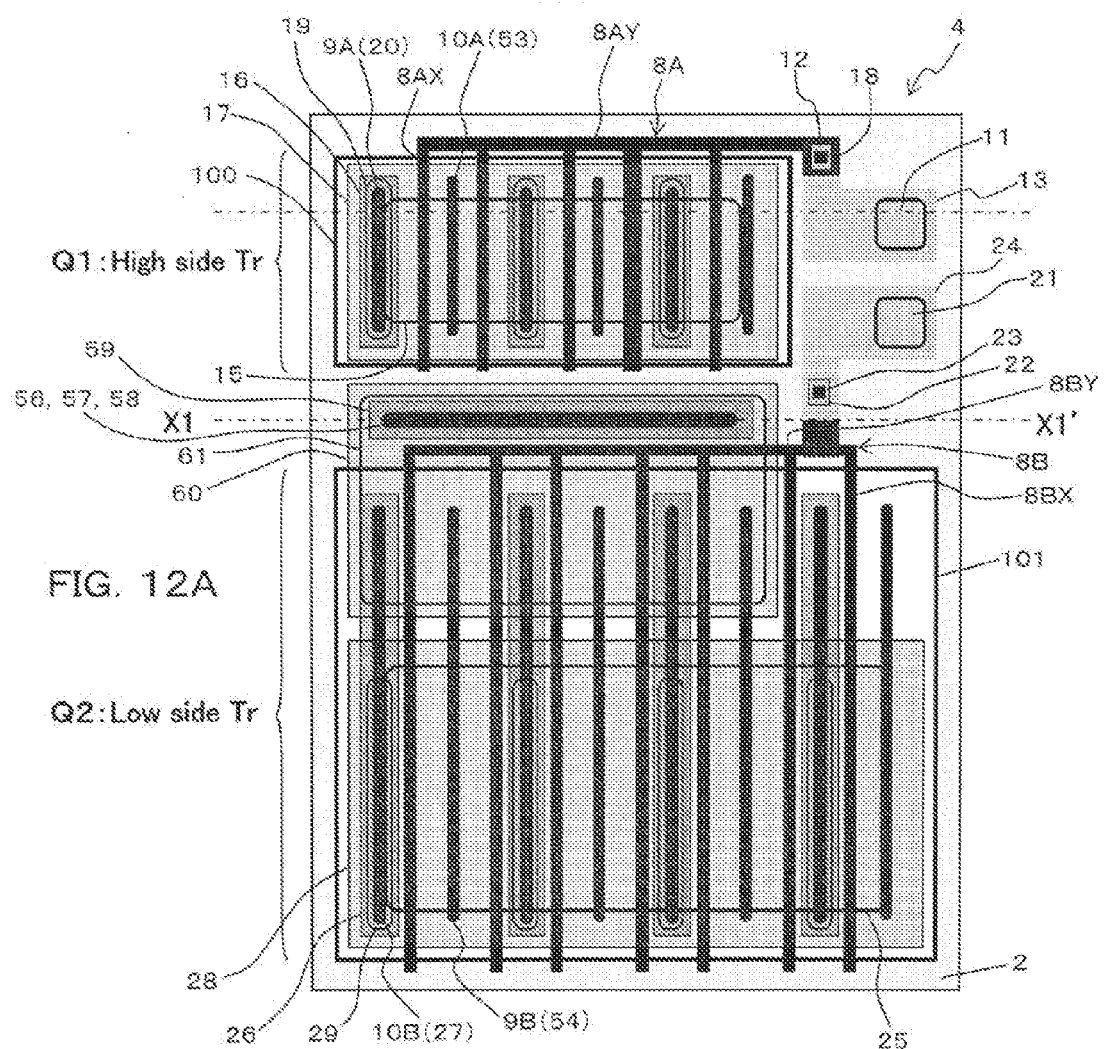
Figure 12B:
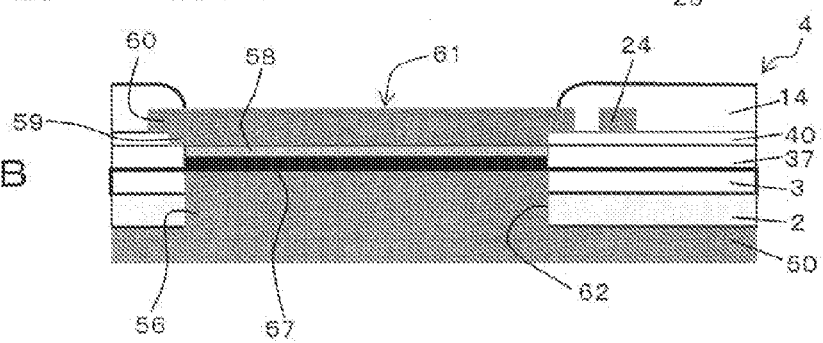

In addition, although a package structure using a metal frame 51 is employed for withdrawing a common pad to the front face side in the above-described embodiment, this is not limiting. For example, as depicted in FIGS. 12A and 12B, a third through hole 62 may be formed in the substrate 2 and the GaN-based semiconductor stacked structure 3, and a third contact 56 made of Cu, for example, may be provided in the third through hole 62. In other words, the third contact 56 coupled to the common interconnection layer 50 provided over the back face of the substrate 2 may be provided in the substrate 2 and the GaN-based semiconductor stacked structure 3, and a contact 57, an interconnection layer 58, a contact 59, and a redistribution layer 60 may be provided in the front face side so as to be coupled to the third contact 56. In this example, the contacts 56, 57, and 59, the interconnection layer 58, and the redistribution layer 60 are formed so as to extend in the direction perpendicular to the direction in which the electrodes 8AX, 9A, 10A, 8BX, 9B, and 10B extend, in the region between the high side transistor region 100 and the low side transistor region 101. In such a case, a portion of the redistribution layer 60 exposed to the surface (the portion not being covered with the insulation film 14), i.e., a portion of the redistribution layer 60 defines the common pad 61. In other words, the common pad 61, coupled to the common interconnection layer 50 provided in the back face side, is provided in the front face side. The common interconnection layer 50 and the common pad 61 are coupled by the third contact 56 provided in the substrate 2 and the GaN-based semiconductor stacked structure 3. In this example, the common pad 61 is provided over the plurality of second drain electrodes 9B. The same elements in FIGS. 12A and 12B as those in the above-described first embodiment are referenced to by the like reference symbols.

[Others]

Note that the present disclosure is not limited to the configurations of the embodiments and their variants set forth above, and may be modified in various manners without departing from the sprit of the present disclosure.

For example, the drain pad 15 is formed over the plurality of first drain electrodes 9A and the source pad 25 is formed over the plurality of second source electrodes 10B in the above-described second embodiment and its variant, this is not limiting. For example, similar to the common interconnection layer of the above-described second embodiment and its variant, the first drain interconnection layer coupled to the plurality of first drain electrodes 9A may be provided over the back face of the substrate 2 and the second source interconnection layer coupled to the plurality of second source electrodes 10B may be provided over the back face of the substrate 2. In such a case, since the first drain interconnection layer, the second source interconnection layer, and the common interconnection layer are all provided over the back face of the substrate 2, they may be masked with an insulation film having windows in the drain pad region, the source pad region, and the common pad region, such that the portions exposed to the surface define a drain pad, a source pad, and a common pad, respectively. In other words, the drain pad, the source pad, and the common pad may be provided in the back face side of the substrate. In such a case, a drain pad is provided under the plurality of first drain electrodes 9A. Thus, the drain pad may be provided over or under the plurality of first drain electrodes 9A. In addition, the source pad is provided under the plurality of second source electrodes 10B. Thus, the source pad may be provided over or under the plurality of second source electrodes 10B. In such a case, the gate pad is also provided in the back face side of the substrate 2. Alternatively, on the contrary to the above-described second embodiment and its variant, a drain pad and a source pad may be provided in the back face side while a common pad may be provided in the front face side. In such a case, the drain pad is provided under a plurality of first drain electrodes, while the source pad is provided under a plurality of second source electrodes.

Figure 13:
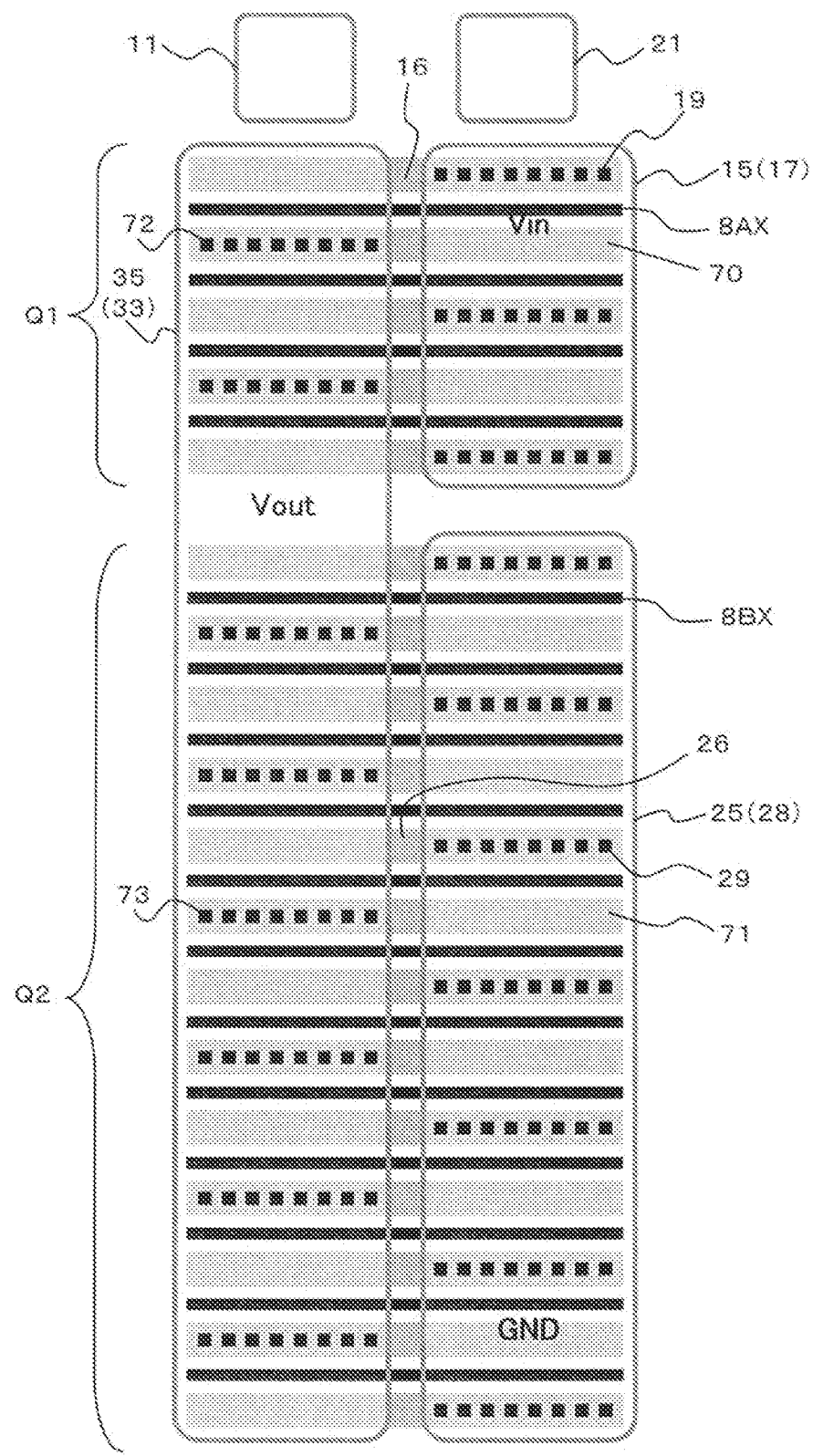
FIG. 13 is a schematic plan view illustrating the structure of a variant of the semiconductor device according to the first embodiment.

Although the first fingers 8AX of the first gate electrode 8A of the high side transistor Q1 and the second fingers 8BX of the second gate electrode 8B of the low side transistor Q2 are arranged in series in the vertical direction in the above-described first embodiment and its variant, for example, this is not limiting. For example, as depicted in FIG. 13, the first fingers 8AX of the first gate electrode 8A of the high side transistor Q1 and the second fingers 8BX of the second gate electrode 8B of the low side transistor Q2 may be arranged in parallel in the horizontal direction. In such a case, a plurality of first source interconnection layers 70 extending, respectively, along the first source electrodes 10A and coupled, respectively, to the plurality of first source electrodes 10A via contacts, are formed, respectively, over the plurality of first source electrodes 10A of the high side transistor Q1. In addition, a plurality of second drain interconnection layers 71 extending, respectively, along the second drain electrodes 9B and coupled, respectively, to the plurality of second drain electrodes 9B via contacts, are formed, respectively, over the plurality of second drain electrodes 9B of the low side transistor Q2. Thereafter, a common redistribution layer 33 coupled to the plurality of first source interconnection layers 70 and the plurality of second drain interconnection layers 71 via contacts 72 and 73 are formed so as to extend from over the plurality of first source interconnection layers 70 to over the plurality of second drain interconnection layers 71. This common redistribution layer 33 is coupled to both the first source electrodes 10A of the high side transistor Q1 and the second drain electrodes 9B of the low side transistor Q2, via the contacts 72 and 73, the first source interconnection layers 70, and the second drain interconnection layers 71. A portion of the common redistribution layer 33 exposed to the surface (the portion not being covered with the insulation film 14), i.e., a portion of the common redistribution layer 33, defines the common pad 35. Even if such a configuration is employed, the common interconnection layer 50 coupled to both the first source electrodes 10A of the high side transistor Q1 and the second drain electrodes 9B of the low side transistor Q2 may be provided in the back face side, like the above-described second embodiment and its variant. In addition, like the above-described variant, all of the first drain interconnection layer, the second source interconnection layer, and the common interconnection layer may be provided over the back face of the substrate 2, such that portions thereof exposed to the surface may define a drain pad, a source pad, and a common pad, respectively. In FIG. 13, the same elements as those in the above-described first embodiment are referenced to by the like reference symbols.

Figure 14:
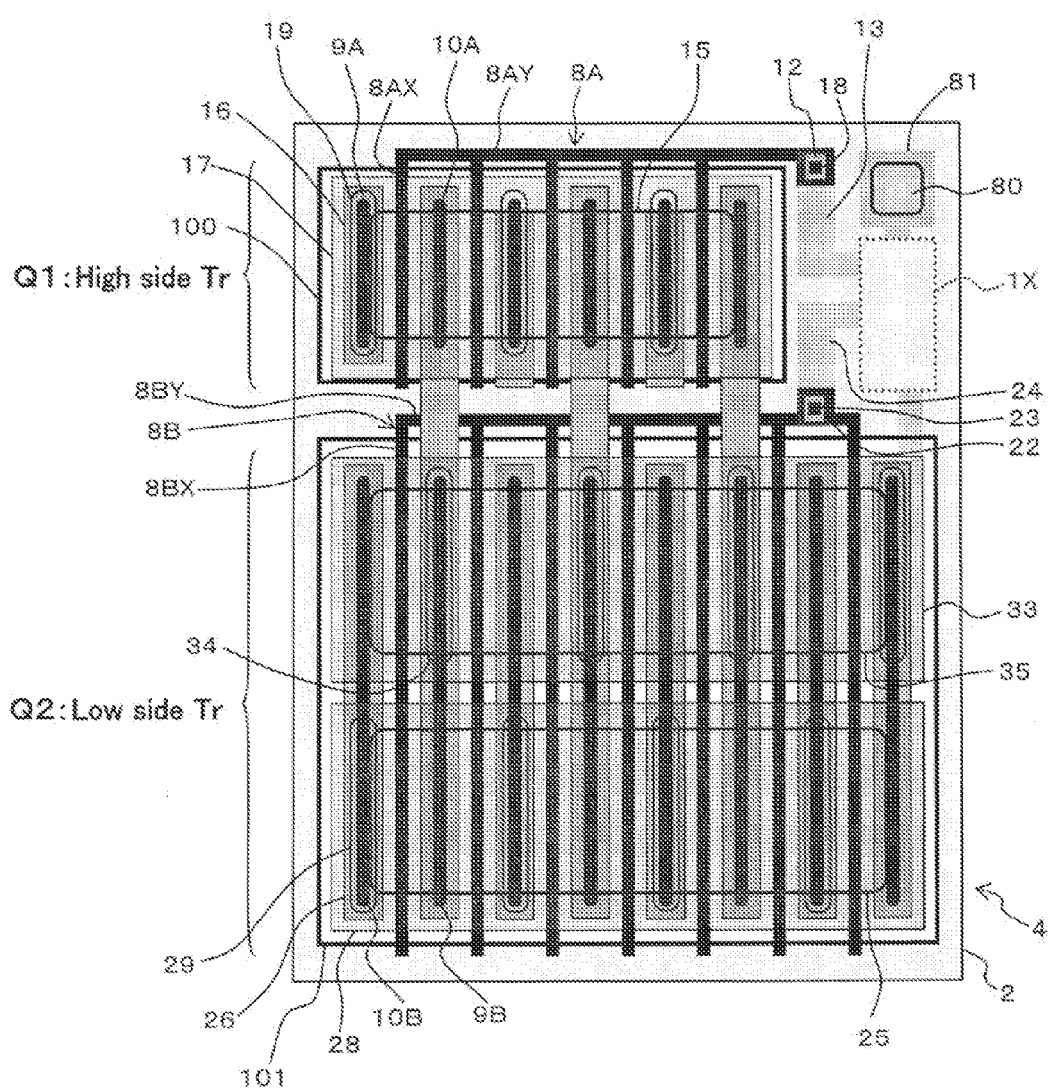
FIG. 14 is a schematic plan view illustrating the structure of a variant of the semiconductor device according to the first embodiment.

In addition, for example, the above-described embodiments and their variants have been described in the context of a semiconductor chip 4 in which the high side transistor Q1 and the low side transistor Q2 are integrated over the single substrate 2, this is not limiting. For example, as depicted in FIG. 14, a control circuit (driving circuit) 1X to output control signals to the first gate electrode 8A of the high side transistor Q1 and the second gate electrode 8B of the low side transistor Q2 may further be integrated over the semiconductor chip 4 wherein the high side transistor Q1 and the low side transistor Q2 are integrated over the single substrate 2. In other words, the high side transistor Q1, the low side transistor Q2, and the control circuit 1X may be monolithically integrated on the single substrate 2 to construct the semiconductor chip 4. In such a case, without providing a first gate pad and a second gate pad, the control circuit 1X may be coupled to the first gate redistribution layer 13 and the second gate redistribution layer 24 and a redistribution layer 81 coupled to the control circuit 1X may be provided, such that a portion of the redistribution layer 81 exposed to the surface may define a pad 80 to input a PWM signal to the control circuit 1X. In addition, in such a case, this power supply apparatus includes a semiconductor chip 4 in which a high side transistor Q1, a low side transistor Q2, the control circuit 1X to output control signals to a first gate electrode 8A of the high side transistor Q1 and a second gate electrode 8B of the low side transistor Q2 are integrated, a coil L coupled to the semiconductor chip 4, and a capacitor C coupled to the coil L. The same elements in FIG. 14 as those in the variant of the above-described first embodiment are referenced to by the like reference symbols. Although FIG. 14 depicts a variant as the variant of the above-described first embodiment, this variant may be applied to other variants of first embodiment or the second embodiment and its variant.

In addition, although the above-described embodiments and their variants have been described in the context in which the control circuit 1 is coupled to a printed board via the first gate pad 11 and the second gate pad 21, this is not limiting.

For example, as depicted in FIGS. 15A and 15B, a semiconductor chip 91, including a control circuit 1Y, to output control signals to a first gate electrode 8A and a second gate electrode 8B, formed over a substrate 90 which is different from the substrate 2, may be attached to the back face of a semiconductor chip 4 having a high side transistor Q1 and a low side transistor Q2 integrated over the single substrate 2. In such a case, the semiconductor chip 4 having the high side transistor Q1 and the low side transistor Q2 integrated thereon is a GaN-based semiconductor chip made from a GaN-based semiconductor material. In contrast, a semiconductor chip 91 including the control circuit 1Y may be a silicon-based semiconductor chip made from a silicon-based semiconductor material, for example. In addition, a redistribution layer 92 may be provided, in place of the first gate pad 11 and the second gate pad 21 over the GaN-based semiconductor chip 4, such that a portion of the redistribution layer 92 exposed to the surface may define a pad 93 to input a PWM signal to the control circuit 1Y. The pad 93, the first gate redistribution layer 13, and the second gate redistribution layer 24 may be coupled to each other via contacts 94 and 96 and interconnection layers 95 and 97 as connections 98A to 98C, thereby coupling between the semiconductor chip 4 and the control circuit 1Y. In FIGS. 15A and 15B, the same elements as those in the variant of the above-described second embodiment are referenced to by the like reference symbols. Although FIGS. 15A and 15B depict a variant as the variant of the above-described first embodiment, this variant may be applied to the first embodiment and its variants or the second embodiment and its variant.

In addition, although the GaN-based semiconductor stacked structure 3 is formed by stacking a GaN layer 5 and an AlGaN layer 6 in the above-described embodiments and their variants, this is not limiting and the GaN-based semiconductor stacked structure 3 may have any GaN-based semiconductor stacked structure which may construct a field effect transistor. For example, any HEMT structure made from a GaN-based semiconductor material may be used. For example, a cap layer may be provided over the electron supply layer.

In addition, although the above-described embodiments and their variants have been described in the context of a power supply apparatus having a high side transistor Q1, a low side transistor Q2, a coil L, a capacitor C, and a control circuit 1 (1X, 1Y), this is not limiting and the present disclosure may be applied to other power supply apparatuses including these elements but having different configurations.

All examples and conditional language recited herein are intended for pedagogical purposes to aid the reader in understanding the invention and the concepts contributed by the inventor to furthering the art, and are to be construed as being without limitation to such For example recited examples and conditions, nor does the organization of such examples in the specification relate to a illustrating of the superiority and inferiority of the invention. Although the embodiments have been described in detail, it should be understood that the various changes, substitutions, and alterations could be made hereto without departing from the spirit and scope of the invention.

What is claimed is:

1. A semiconductor device comprising:
 a first transistor including a first GaN-based semiconductor stacked structure formed over a substrate, a first gate electrode having a plurality of first fingers over the first GaN-based semiconductor stacked structure, a plurality of first drain electrodes provided along the first fingers, and a plurality of first source electrodes provided along the first fingers;

a second transistor including a second GaN-based semiconductor stacked structure formed over the substrate, a second gate electrode having a plurality of second fingers over the second GaN-based semiconductor stacked structure, and a plurality of second drain electrodes provided along the second fingers, and a plurality of second source electrodes provided along the second fingers;

a drain pad provided over or under the plurality of first drain electrodes, and coupled to the plurality of first drain electrodes;

a source pad provided over or under the plurality of second source electrodes, and coupled to the plurality of second source electrodes; and a common pad coupled to the plurality of first source electrodes and the plurality of second drain electrodes;

a common interconnection layer coupled to the plurality of first source electrodes and the plurality of second drain electrodes;

a plurality of first through holes provided in the substrate and the first GaN-based semiconductor stacked structure;

a plurality of first contacts provided, respectively, in the plurality of first through holes and coupled, respectively, to the plurality of first source electrodes;

a plurality of second through holes provided in the substrate and the second GaN-based semiconductor stacked structure; and a plurality of second contacts provided, respectively, in the plurality of second through holes and coupled, respectively, to the plurality of second drain electrodes, wherein the common interconnection layer is provided on the substrate under the plurality of first source electrodes and the plurality of second drain electrodes, the common interconnection layer being coupled to the respective first source electrodes via the respective first contacts and coupled to the respective second drain electrodes via the respective second contacts, and the common pad is coupled to the plurality of first source electrodes and the plurality of second drain electrodes via the common interconnection layer.

2. The semiconductor device according to claim 1, wherein the common pad is a metal frame coupled to the common interconnection layer, and extending from a first side of the substrate to a second side opposite to the first side, the first transistor and the second transistor are provided at the second side and not provided at the first side.

3. The semiconductor device according to claim 1, wherein the common pad is provided in a first side of the substrate, the semiconductor device further comprising:
 a third through hole provided in the substrate and a third GaN-based semiconductor stacked structure formed over the substrate, and
 a third contact provided in the third through hole, and coupling between the common interconnection layer and the common pad.

4. The semiconductor device according to claim 1, further comprising:
 a plurality of first drain interconnection layers provided, respectively, over the plurality of first drain electrodes, and coupled, respectively, to the plurality of first drain electrodes;
 a first drain redistribution layer provided over the plurality of first drain interconnection layers, and coupled to the plurality of first drain interconnection layers;
 a plurality of second source interconnection layers provided, respectively, over the plurality of second source electrodes, and coupled, respectively, to the plurality of second source electrodes; and
 a second source redistribution layer provided over the plurality of second source interconnection layers, and coupled to the plurality of second source interconnection layers,
 wherein the drain pad is defined by a portion of the first drain redistribution layer, and the source pad is defined by a portion of the second source redistribution layer.

5. The semiconductor device according to claim 1, further comprising:
 a first drain interconnection layer provided over the plurality of first drain electrodes, and coupled to the plurality of first drain electrodes; and
 a second source interconnection layer provided over the plurality of second source electrodes, and coupled to the plurality of second source electrodes;
 wherein the drain pad is defined by a portion of the first drain interconnection layer, and the source pad is defined by a portion of the second source interconnection layer.

6. The semiconductor device according to claim 1, wherein a distance between one of the first fingers and one of the first drain electrodes provided along the one of the first fingers is greater than a distance between the one of the first fingers and one of the first source electrodes provided along the one of the first fingers, and a distance between one of the second fingers and one of the second drain electrodes provided along the one of the second fingers is greater than a distance between the one of the second fingers and one of the second source electrodes provided along the one of the second fingers.

7. The semiconductor device according to claim 1 further comprising a control circuit integrated over the substrate, the control circuit being configured to output a control signal to the first gate electrode and the second gate electrode.

8. A power supply apparatus comprising:
 a semiconductor device comprising:
  a first transistor including a first GaN-based semiconductor stacked structure formed over a substrate, a first gate electrode having a plurality of first fingers over the first GaN-based semiconductor stacked structure, a plurality of first drain electrodes provided along the first fingers, and a plurality of first source electrodes provided along the first fingers;
  a second transistor including a second GaN-based semiconductor stacked structure formed over the substrate, a second gate electrode having a plurality of second fingers over the second GaN-based semiconductor stacked structure, a plurality of second drain electrodes provided along the second fingers, and a plurality of second source electrodes provided along the second fingers;
  a drain pad provided over or under the plurality of first drain electrodes, and coupled to the plurality of first drain electrodes;
  a source pad provided over or under the plurality of second source electrodes, and coupled to the plurality of second source electrodes; and
  a common pad coupled to the plurality of first source electrodes and the plurality of second drain electrodes;
  a common interconnection layer coupled to the plurality of first source electrodes and the plurality of second drain electrodes;
  a plurality of first through holes provided in the substrate and the first GaN-based semiconductor stacked structure;

a plurality of first contacts provided, respectively, in the plurality of first through holes and coupled, respectively, to the plurality of first source electrodes;

a plurality of second through holes provided in the substrate and the second GaN-based semiconductor stacked structure; and a plurality of second contacts provided, respectively, in the plurality of second through holes and coupled, respectively, to the plurality of second drain electrodes, wherein the common interconnection layer is provided on the substrate under the plurality of first source electrodes and the plurality of second drain electrodes, the common interconnection layer being coupled to the respective first source electrodes via the respective first contacts, and is couple to the respective second drain electrodes via the respective second contacts, and the common pad is coupled to the plurality of first source electrodes and the plurality of second drain electrodes via the common interconnection layer;

a coil coupled to the semiconductor device;

a capacitor coupled to the coil; and a control circuit configured to control the first transistor and the second transistor.

9. The power supply apparatus according to claim 8, wherein the control circuit is integrated over the substrate.

10. The power supply apparatus according to claim 8, wherein the control circuit is formed over a different substrate and is coupled to the semiconductor device.

* * * * *